United States Patent
Meyers et al.

(10) Patent No.: US 11,988,958 B2
(45) Date of Patent: *May 21, 2024

(54) ORGANOMETALLIC SOLUTION BASED HIGH RESOLUTION PATTERNING COMPOSITIONS

(71) Applicant: Inpria Corporation, Corvallis, OR (US)

(72) Inventors: Stephen T. Meyers, Corvallis, OR (US); Douglas A. Keszler, Corvallis, OR (US); Kai Jiang, Corvallis, OR (US); Jeremy T. Anderson, Corvallis, OR (US); Andrew Grenville, Corvallis, OR (US)

(73) Assignee: Inpria Corporation, Corvallis, OR (US)

(*) Notice: Subject to any disclaimer, the term of this patent is extended or adjusted under 35 U.S.C. 154(b) by 652 days.

This patent is subject to a terminal disclaimer.

(21) Appl. No.: 16/536,768

(22) Filed: Aug. 9, 2019

(65) Prior Publication Data

US 2019/0369489 A1  Dec. 5, 2019

Related U.S. Application Data

(63) Continuation of application No. 16/007,242, filed on Jun. 13, 2018, now Pat. No. 10,416,554, which is a continuation of application No. 14/983,220, filed on Dec. 29, 2015, now Pat. No. 10,025,179, which is a continuation of application No. 13/973,098, filed on Aug. 22, 2013, now Pat. No. 9,310,684.

(51) Int. Cl.
| | | |
|---|---|---|
| *G03F 7/004* | (2006.01) | |
| *G03F 7/09* | (2006.01) | |
| *G03F 7/20* | (2006.01) | |
| *G03F 7/30* | (2006.01) | |
| *G03F 7/32* | (2006.01) | |

(52) U.S. Cl.
CPC .......... *G03F 7/0042* (2013.01); *G03F 7/0043* (2013.01); *G03F 7/09* (2013.01); *G03F 7/20* (2013.01); *G03F 7/2002* (2013.01); *G03F 7/2037* (2013.01); *G03F 7/30* (2013.01); *G03F 7/32* (2013.01); *G03F 7/322* (2013.01); *G03F 7/325* (2013.01)

(58) Field of Classification Search
CPC .... G03F 7/0042; G03F 7/0043; G03F 7/0044; G03F 7/2037
See application file for complete search history.

(56) References Cited

U.S. PATENT DOCUMENTS

| | | |
|---|---|---|
| 3,385,915 A | 5/1968 | Hamling |
| 4,014,858 A | 3/1977 | Chipman et al. |
| 4,102,683 A | 7/1978 | DiPiazza |
| 4,104,292 A | 8/1978 | Dworkin et al. |
| 4,144,222 A | 3/1979 | Shinmi et al. |
| 4,174,346 A | 11/1979 | Collins et al. |
| 4,370,405 A | 1/1983 | O'Toole et al. |
| 4,380,559 A | 4/1983 | Mandai et al. |
| 4,601,917 A | 7/1986 | Russo et al. |
| 4,639,208 A | 1/1987 | Inui et al. |
| 4,732,841 A | 3/1988 | Radigan |
| 4,851,481 A | 1/1989 | Kuriyama et al. |
| 4,827,137 A | 5/1989 | Collins et al. |
| 4,891,303 A | 1/1990 | Garza et al. |
| 4,910,122 A | 3/1990 | Arnold et al. |
| 5,025,094 A | 6/1991 | King |
| 5,672,243 A | 9/1997 | Hsia et al. |
| 6,020,269 A | 2/2000 | Wang et al. |
| 6,060,380 A | 5/2000 | Subramanian et al. |
| 6,183,716 B1 | 2/2001 | Sleight et al. |
| 6,194,323 B1 | 2/2001 | Downey et al. |
| 6,197,896 B1 | 3/2001 | Aviram et al. |
| 6,268,457 B1 | 7/2001 | Kennedy et al. |
| 6,287,951 B1 | 9/2001 | Lucas et al. |
| 6,387,012 B1 | 5/2002 | Mitamura |
| 6,420,088 B1 | 7/2002 | Angelopoulos et al. |
| 6,583,071 B1 | 6/2003 | Weidman et al. |

(Continued)

FOREIGN PATENT DOCUMENTS

| | | |
|---|---|---|
| CN | 1457504 A | 11/2003 |
| CN | 1821879 A | 8/2006 |

(Continued)

OTHER PUBLICATIONS

Machine English Translation of CN 1800988 (Year: 2010).*
Office Action from co-pending Taiwan Application No. 108116014 dated Oct. 16, 2019.
Preliminary Rejection from co-pending Korean Application No. 10-2019-7028281 dated Nov. 28, 2019.
Office Action From Co-pending Japanese Application No. 2019-026557 dated Feb. 18, 2019.
Ahmed et al., "Synthesis And Characterization Of Zirconium And Hafnium Sulfates, Hydroxide Sulfates And Oxide Sulfates", Acta Chemica Scandinavica, 53:24-33 (1999).
Chandrasekhar et al., "Organotin Assemblies Containing SN-O Bonds," Coordination Chemistry Reviews 235:1-52 (2002).

(Continued)

*Primary Examiner* — Daborah Chacko-Davis
(74) *Attorney, Agent, or Firm* — Christensen, Fonder, Dardi PLLC; Diane E. Bennett; Peter S. Dardi

(57) ABSTRACT

Organometallic solutions have been found to provide high resolution radiation based patterning using thin coatings. The patterning can involve irradiation of the coated surface with a selected pattern and developing the pattern with a developing agent to form the developed image. The patternable coatings may be susceptible to positive-tone patterning or negative-tone patterning based on the use of an organic developing agent or an aqueous acid or base developing agent. The radiation sensitive coatings can comprise a metal oxo/hydroxo network with organic ligands. A precursor solution can comprise an organic liquid and metal polynuclear oxo-hydroxo cations with organic ligands having metal carbon bonds and/or metal carboxylate bonds.

21 Claims, 10 Drawing Sheets

(56) References Cited

U.S. PATENT DOCUMENTS

| | | | |
|---|---|---|---|
| 6,730,454 B2 | 5/2004 | Pfeiffer et al. | |
| 6,844,604 B2 | 1/2005 | Lee et al. | |
| 6,927,108 B2 | 8/2005 | Weng et al. | |
| 6,946,677 B2 | 9/2005 | Ostergard | |
| 7,001,821 B2 | 2/2006 | Aggarwal et al. | |
| 7,208,341 B2 | 4/2007 | Lee et al. | |
| 7,256,129 B2 | 8/2007 | Nam et al. | |
| 7,773,365 B2 | 8/2010 | Herman et al. | |
| 7,799,503 B2 | 9/2010 | Brodsky et al. | |
| 8,053,370 B2 | 11/2011 | Yang et al. | |
| 8,092,703 B2 | 1/2012 | Ishibashi et al. | |
| 8,158,338 B2 | 4/2012 | Fednyshyn | |
| 8,257,910 B1 | 9/2012 | Guerrero et al. | |
| 8,415,000 B2 | 4/2013 | Stowers et al. | |
| 8,426,107 B2 | 4/2013 | Takashi et al. | |
| 8,828,493 B2 | 9/2014 | Cheng et al. | |
| 8,951,917 B2 | 2/2015 | Ogihara et al. | |
| 9,310,684 B2 | 4/2016 | Meyers et al. | |
| 10,025,179 B2 | 7/2018 | Meyers et al. | |
| 10,416,554 B2* | 9/2019 | Meyers | G03F 7/20 |
| 2002/0037481 A1 | 3/2002 | Lee et al. | |
| 2002/0076495 A1 | 6/2002 | Maloney et al. | |
| 2002/0160298 A1 | 10/2002 | Minami et al. | |
| 2003/0124457 A1 | 7/2003 | Jung et al. | |
| 2004/0067444 A1 | 4/2004 | Wakabayahsi et al. | |
| 2004/0105163 A1 | 6/2004 | Bryan et al. | |
| 2004/0164293 A1* | 8/2004 | Maloney | H01L 21/76813 257/E21.235 |
| 2005/0242330 A1 | 11/2005 | Herman et al. | |
| 2006/0088962 A1 | 4/2006 | Herman et al. | |
| 2006/0234138 A1 | 10/2006 | Fehlhaber et al. | |
| 2008/0055597 A1 | 3/2008 | Sun et al. | |
| 2009/0155546 A1 | 6/2009 | Yamashita et al. | |
| 2009/0174036 A1 | 7/2009 | Fuller et al. | |
| 2009/0214823 A1 | 8/2009 | Cheng et al. | |
| 2009/0317742 A1* | 12/2009 | Toriumi | G03F 7/0392 430/319 |
| 2010/0044698 A1 | 2/2010 | Herman et al. | |
| 2010/0099908 A1 | 4/2010 | Yoshitomo et al. | |
| 2010/0167217 A1 | 7/2010 | Ando | |
| 2010/0184259 A1 | 7/2010 | Radigan et al. | |
| 2010/0279228 A1 | 11/2010 | Davis et al. | |
| 2011/0045406 A1 | 2/2011 | Keszler et al. | |
| 2011/0135823 A1 | 6/2011 | Lee et al. | |
| 2011/0166268 A1 | 7/2011 | Deelman et al. | |
| 2011/0206599 A1 | 8/2011 | Keszler et al. | |
| 2011/0244403 A1 | 10/2011 | Carcasi et al. | |
| 2011/0293888 A1 | 12/2011 | Stowers et al. | |
| 2012/0202349 A1 | 8/2012 | Sun | |
| 2012/0223418 A1 | 9/2012 | Stowers et al. | |
| 2012/0315451 A1* | 12/2012 | Malik | C08F 4/12 428/209 |
| 2013/0078796 A1 | 3/2013 | Ganesan et al. | |
| 2013/0224652 A1 | 8/2013 | Bass et al. | |
| 2013/0253161 A1 | 9/2013 | Amako et al. | |
| 2014/0303283 A1 | 10/2014 | Ding et al. | |
| 2016/0116839 A1 | 4/2016 | Meyers et al. | |
| 2017/0184960 A1 | 6/2017 | Naruoka et al. | |
| 2017/0184961 A1 | 6/2017 | Nakagawa et al. | |
| 2019/0369489 A1 | 12/2019 | Meyers et al. | |
| 2022/0365429 A1 | 11/2022 | Meyers et al. | |
| 2023/0004082 A1* | 1/2023 | Meyers | G03F 7/0043 |

FOREIGN PATENT DOCUMENTS

| | | | |
|---|---|---|---|
| CN | 1800988 | * 2/2010 | G03F 7/26 |
| CN | 101713923 A | 5/2010 | |
| CN | 102027603 A | 4/2011 | |
| EP | 0094914 A2 | 11/1983 | |
| EP | 1326136 A1 | 7/2003 | |
| EP | 1992665 A1 | 11/2008 | |
| EP | 1067595 A2 | 1/2011 | |
| GB | 2466486 | 6/2010 | |
| JP | 57-123126 | 7/1982 | |
| JP | S63-241061 A | 10/1988 | |
| JP | H03-148659 A | 6/1991 | |
| JP | H7-056354 A | 3/1995 | |
| JP | H10-237078 A | 9/1998 | |
| JP | 2001-81560 A | 3/2001 | |
| JP | 2002-015631 A | 1/2002 | |
| JP | 2003-218118 A | 7/2003 | |
| JP | 2004-512672 A | 4/2004 | |
| JP | 2004-172272 A | 6/2004 | |
| JP | 2006-284947 | 10/2006 | |
| JP | 2007-178452 A | 7/2007 | |
| JP | 2007-298841 A | 11/2007 | |
| JP | 2008-091215 A | 4/2008 | |
| JP | 2007-514182 | 5/2008 | |
| JP | 2009-533521 A | 9/2009 | |
| JP | 2010-094583 A | 4/2010 | |
| JP | 2010-243773 A | 10/2010 | |
| JP | 2010-256706 A | 11/2010 | |
| JP | 2011-053566 A | 3/2011 | |
| JP | 2011-207693 A | 10/2011 | |
| JP | 2011-209694 A | 10/2011 | |
| JP | 2014-048508 A | 3/2014 | |
| JP | 2016-530565 A | 9/2016 | |
| JP | 2018-502173 A | 1/2018 | |
| JP | 2018-017780 A | 2/2018 | |
| KR | 10-2003-0007904 | 1/2003 | |
| KR | 10-2011-0132288 | 12/2011 | |
| KR | 10-2012-0093777 A | 8/2012 | |
| TW | 513745 | 12/2002 | |
| TW | 2008-31695 A | 8/2008 | |
| TW | 2012-22144 A | 6/2012 | |
| WO | 01-95690 A1 | 12/2001 | |
| WO | 2005-043246 | 5/2005 | |
| WO | 2008-082448 | 7/2008 | |
| WO | 2009-120169 | 10/2009 | |
| WO | 2009-138474 A1 | 11/2009 | |
| WO | 2009-139421 A1 | 11/2009 | |
| WO | 2010-000504 A1 | 1/2010 | |
| WO | 2009-139421 A | 9/2011 | |
| WO | 2013-128313 A1 | 9/2013 | |
| WO | 2014-150411 A1 | 9/2014 | |
| WO | 2016-065120 A1 | 4/2016 | |
| WO | 2016-043198 A1 | 7/2017 | |
| WO | 2016-043200 A1 | 7/2017 | |
| WO | 2018-123388 A1 | 7/2018 | |
| WO | 2018-123537 A1 | 7/2018 | |
| WO | 2018-139109 A1 | 8/2018 | |
| WO | 2018-168221 A1 | 9/2018 | |

OTHER PUBLICATIONS

Eychenne-Baron et al., "New Synthesis Of The Nanobuilding Block {(BuSn)12O14(OH)6 }2+ And Exchange Properties Of {(BuSn)12O14(OH)6}(O3SC6H4CH3)2," Journal Of Organometallic Chemistry, 567:137-142 (1998).

Eychenne-Baron et al., "Reaction Of Butyltin Hydroxide Oxide With p-Toluenesulfonic Acid: Synthesis, X-ray Crystal Analysis, And Multinuclear NMR Characterization Of {(BuSn)12O14(OH)6}(4-CH3C6H4SO3)2," Organometallics, 19:1940-1949 (2000).

Meyers et al., "Solution-Processed Aluminum Oxide Phosphate Thin-Film Dielectrics," Chemical Materials, 19 (16):4023-4029 (2007). (Abstract Only).

Nakata et al., "Improvement Of InGaZnO4 Thin Film Transistors Characteristics Utilizing Excimer Laser Annealing," The Japan Society of Applied Physics (2009). (Abstract Only).

Neef et al., "Effects Of Carbon/Hardmask Interactions On Hardmask Performance," Proc. Of SPIE, 7273, 727311-1-727311-7 (2009).

Owen et al., "1/8 μm Optical Lithography," Journal Vac. Science Technology B 10, 3032 (1992). (Abstract Only).

Stowers, "Direct Patterning Of Solution Deposited Metal Oxides," A Dissertation To Oregon State University (Aug. 14, 2008). (149 pages).

Stowers et al., "High Resolution, High Sensitivity Inorganic Resists," Microelectronic Engineering, 86:730-733 (2009).

Stowers et al., "Directly Patterned Inorganic Hardmask For EUV Lithography," Proc. SPIE 7969, 796915; http://dx.doi.org/10.1117/12.879542 (2011).

(56) References Cited

OTHER PUBLICATIONS

Wang et al., "TiO2 Micro-Devices Fabricated By Laser Direct Writing," Optics Express, 19(18):17390-17935 (Aug. 29, 2011).
Zhang et al., "Stabilization Of Cubic ZrO2 With Rh(III) And/Or La(III)," Journal Of Solid State Chemistry, 72:131-136 (1988).
Zimmerman, "Extension Options For 193nm Immersion Lithography," Journal of Photopolymer Science And Technology, 22(5):625-634 (2009). (Abstract Only).
International Standard ISO 21348 "Space Environment (Natural And Artificial)—Process For Determining Solar Irradiances," First Edition, Reference No. ISO 21348:2007(E); (20 pages) (2007).
International Search Report And Written Opinion For International Application No. PCT/US14/48212 Dated Mar. 3, 2015 (10 pages).
Office Action From Co-pending Korean Application No. 10-2016-7007433 dated Aug. 3, 2017.
Office Action From Co-pending Japanese Application No. 2016-536100 dated Jan. 11, 2018.
Office Action From Co-pending Taiwan Application No. 103126978 dated Aug. 13, 2018.
Meriem et al., "Synthesis, characterization and in vitro antitumour activity of di-n-butyltin( IV) derivatives of some aromatic carboxylic acids, including aspirin", Applied Organometallic Chemistry, vol. 5, p. 191-201, (1991).
Preliminary Rejection from co-pending Korean Application No. 10-2019-7028281 dated May 26, 2020.
Preliminary Rejection from co-pending Korean Application No. 10-2020-7036336 dated Mar. 9, 2021.
Office Action from corresponding Japanese Patent Application No. 2020-195146 dated Oct. 12, 2021.
Office Action from corresponding Chinese Patent Application No. 202010158111.0 dated Oct. 26, 2021.
Office Action from co-pending Taiwan Application No. 110114728 dated Aug. 27, 2021.
Office Action from corresponding Korean Patent Application No. 10-2021-7035402 dated Jan. 25, 2022.
1 Office Action from corresponding Korean Patent Application No. 10-2021-7035402 dated Nov. 21, 2022.
Office Action from corresponding Japanese Patent Application No. 2022-100501 dated May 30, 2023.
Amador et al., "Patterning chemistry of HafSOx resist", Proc. SPIE 9051, Advances in Patterning Materials and Processes XXXI, 90511A doi: 10.1117/12.2046605, (Mar. 27, 2014).
Anderson et al., "Solution-Processed HafSOx and ZircSOx Inorganic Thin-Film Dielectrics and Nanolaminates", Advanced Functional Materials, vol. 17, p. 2117-2124, (2007).
Jouve et al., "Overcoming pattern collapse of ultra high resolution dense lines obtained with EUV resists", Proceedings of SPIE 5753, p. 720-731, (May 2005).
Matsuzawa et al., "Theoretical Estimation of Absorption Coefficients of Various Polymers at 13 nm", Journal of Photopolymer Science and Technology, vol. 12 No. 4, p. 571-576, (1999).
Ober et al., "New oxide nanoparticle extreme-UV photoresists achieve high sensitivity", SPIE Newsroom, p. 2-4, (2014).
Puurunen et al., "Hafnium oxide films by atomic layer deposition for high-κ gate dielectric applications: Analysis of the density of nanometer-thin films", applied Physics Letters, vol. 86 No. 073116, (2005).
Stowers et al., "Imageable Oxides: New Solutions for Resist," International Symposium on Extreme Ultraviolet Lithography, (Oct. 2010).
Telecky et al., "Photopatternable Inorganic Hardmask," J. Vac. Sci. Technol. B 28(6), (2010).
Trikeriotis et al., "Development of an inorganic photoresist for DUV, EUV, and electron beam imaging," Proceedings of SPIE 76390E, Advances in Resist Materials and Processing Technology XXVII, doi: 10.1117/12.864472 (Mar. 25, 2010).
Declaration by Karey Holland dated Oct. 16, 2023.

\* cited by examiner

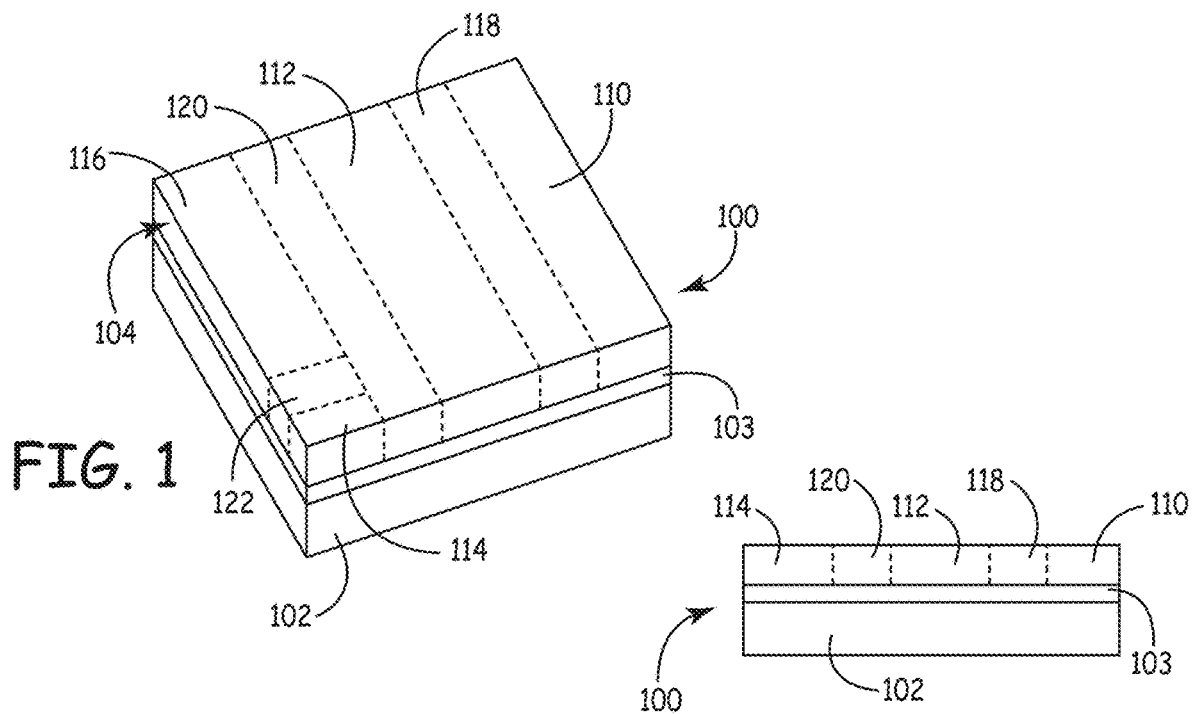
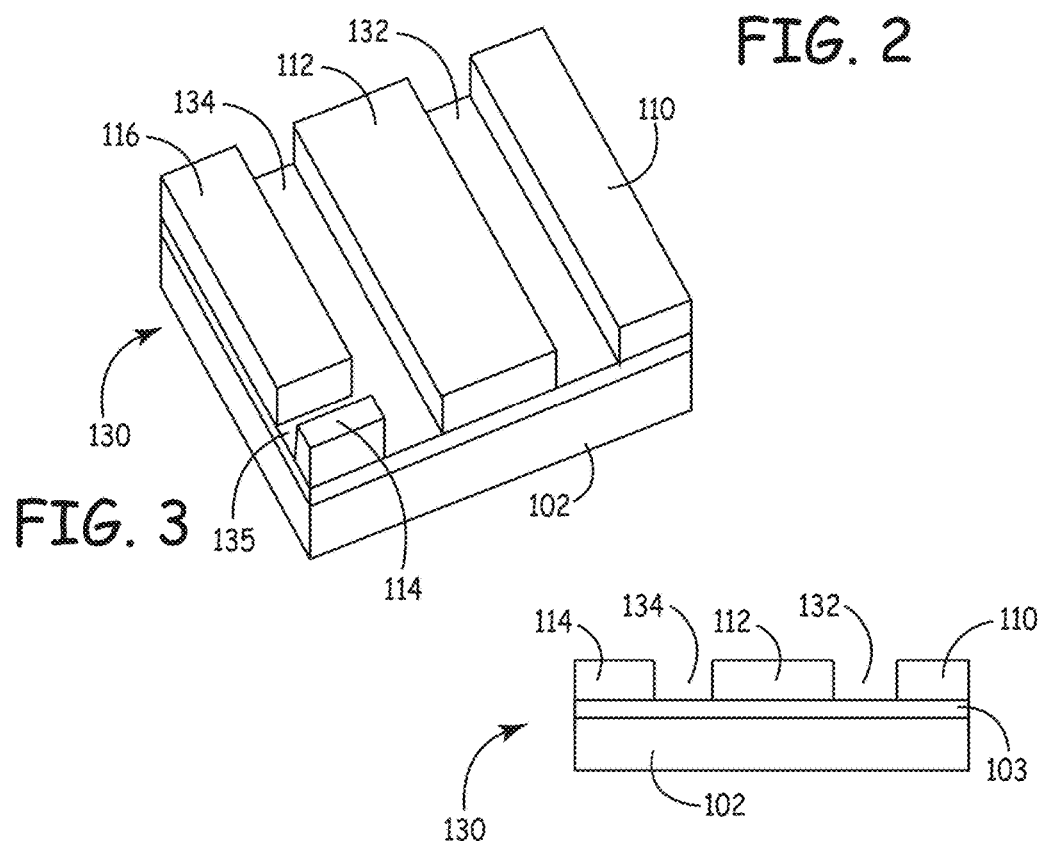

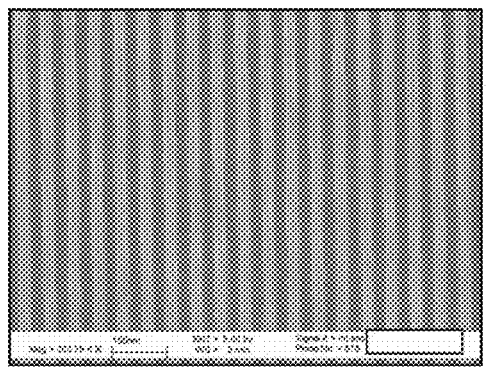
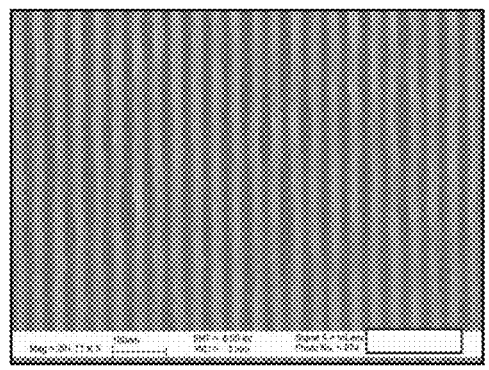
FIG. 12A    FIG. 12B
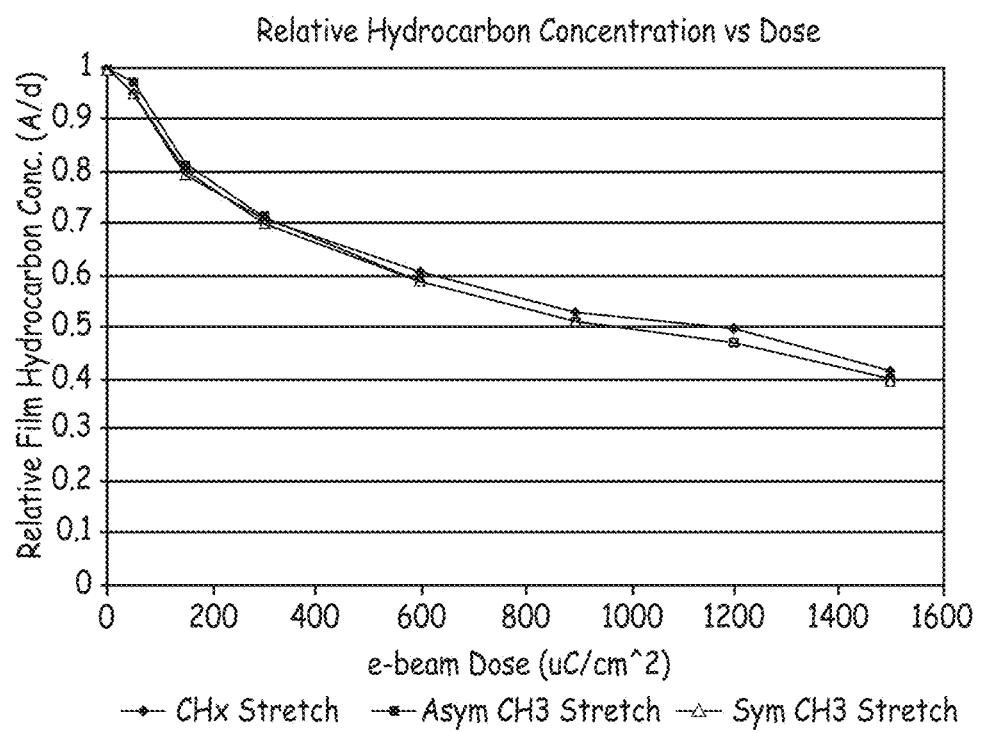
FIG. 13

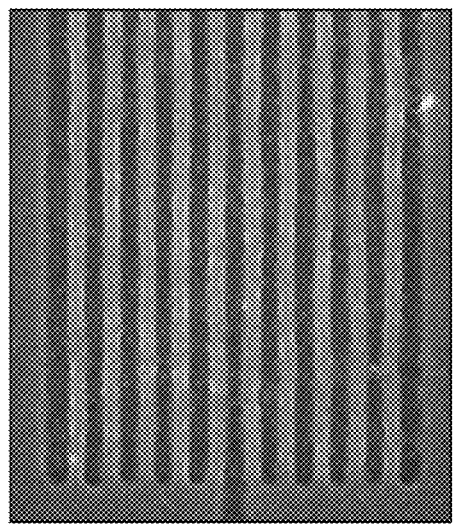
FIG. 14
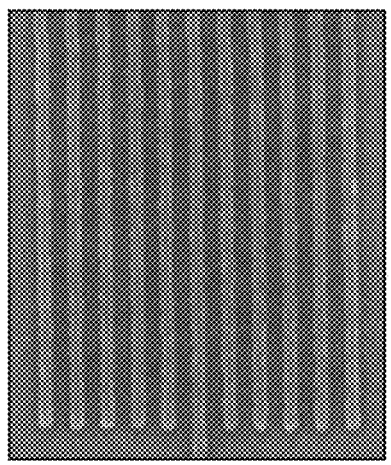 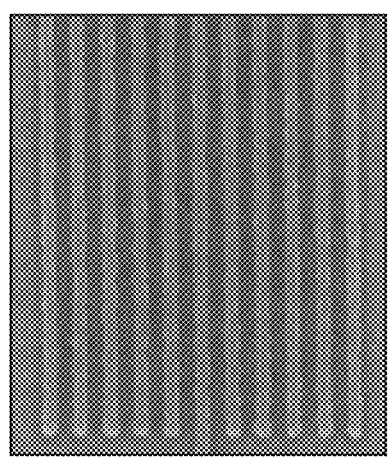 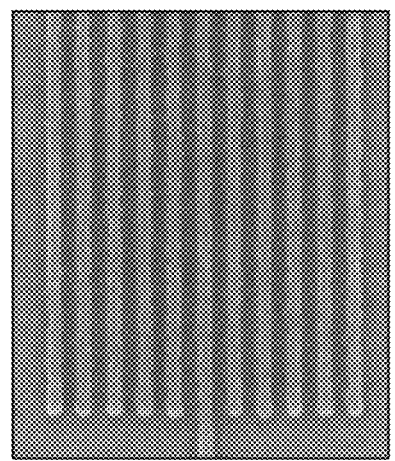
FIG. 15A     FIG. 15B     FIG. 15C

ORGANOMETALLIC SOLUTION BASED HIGH RESOLUTION PATTERNING COMPOSITIONS

CROSS REFERENCE TO RELATED APPLICATIONS

This application is a continuation of U.S. patent application Ser. No. 16/007,242 to Meyers et al., filed Jun. 13, 2018, entitled "Organometallic Solution Based on High Resolution Patterning Compositions," which is a continuation of U.S. patent application Ser. No. 14/983,220, now U.S. Pat. No. 10,025,179 to Meyers et al., filed on Dec. 29, 2015, entitled "Organometallic Solution Based on High Resolution Patterning Compositions," which is a continuation of U.S. patent application Ser. No. 13/973,098, now U.S. Pat. No. 9,310,684 to Meyers et al. filed on Aug. 22, 2013, entitled "Organometallic Solution Based on High Resolution Patterning Compositions," all of which are incorporated herein by reference.

STATEMENT AS TO GOVERNMENT RIGHTS

This invention was made with government support under grant IIP-0912921 awarded by the U.S. National Science Foundation. The Government has certain rights in the invention.

FIELD OF THE INVENTION

The invention relates to radiation based methods for the performance of patterning materials using an organometallic coating composition. The invention further relates to precursor solutions that can be deposited to form organometallic coatings that can be patterned with very high resolution with radiation and to the coated substrates and coatings formed with the precursor solutions before and after patterning.

BACKGROUND OF THE INVENTION

For the formation of semiconductor-based devices as well as other electronic devices or other complex fine structures, materials are generally patterned to integrate the structure. Thus, the structures are generally formed through an iterative process of sequential deposition and etching steps through which a pattern is formed of the various materials. In this way, a large number of devices can be formed into a small area. Some advances in the art can involve that reduction of the footprint for devices, which can be desirable to enhance performance.

Organic compositions can be used as radiation patterned resists so that a radiation pattern is used to alter the chemical structure of the organic compositions corresponding with the pattern. For example, processes for the patterning of semiconductor wafers can entail lithographic transfer of a desired image from a thin film of organic radiation-sensitive material. The patterning of the resist generally involves several steps including exposing the resist to a selected energy source, such as through a mask, to record a latent image and then developing and removing selected regions of the resist. For a positive-tone resist, the exposed regions are transformed to make such regions selectively removable, while for negative-tone resist, the unexposed regions are more readily removable.

Generally, the pattern can be developed with radiation, a reactive gas, or liquid solution to remove the selectively sensitive portion of the resist while the other portions of the resist act as a protective etch resistant layer. Liquid developers can be particularly effective for developing the image. The substrate can be selectively etched through the windows or gaps in the remaining areas of the protective resist layer. Alternatively, desired materials can be deposited into the exposed regions of the underlying substrate through the developed windows or gaps in the remaining areas of the protective resist layer. Ultimately, the protective resist layer is removed. The process can be repeated to form additional layers of patterned material. The functional inorganic materials can be deposited using chemical vapor deposition, physical vapor deposition or other desired approaches. Additional processing steps can be used, such as the deposition of conductive materials or implantation of dopants. In the fields of micro- and nanofabrication, feature sizes in integrated circuits have become very small to achieve high-integration densities and improve circuit function.

SUMMARY OF THE INVENTION

In a first aspect, the invention pertains to a method for patterning a substrate with radiation, the method comprising the steps of irradiating a coated substrate along a selected pattern to form an irradiated structure with a region of irradiated coating and a region with un-irradiated coating and selectively developing the irradiated structure to remove a substantial portion of the irradiated coating or of the un-irradiated coating to form a patterned substrate. The coated substrate generally comprises a coating that comprises a metal oxo-hydroxo network with organic ligands with a metal carbon bonds and/or with metal carboxylate bonds.

In a further aspect, the invention pertains to a coated substrate comprising a radiation sensitive coating having an average thickness of no more than about 10 microns and a thickness variation of no more than about 50% from the average at any point along the coating, the coating comprising metal oxo-hydroxo network with metal cations having organic ligands with a metal carbon bonds and/or with metal carboxylate bonds.

In another aspect, the invention pertains to a patterned substrate comprising a substrate with a surface and a first coating at selected regions along the surface and absent at other regions along the surface. Generally, the first coating comprises metal oxo-hydroxo network and organic ligands with metal cations having organic ligands with a metal carbon bonds and/or with metal carboxylate bonds. Alternatively, the first coating is soluble in at least some organic liquids, or the first coating is soluble in aqueous bases.

In additional aspects, the invention pertains to a precursor solution comprising an organic liquid and from about 0.01M to about 1.4M metal polynuclear oxo/hydroxo cation with organic ligands having a metal carbon bonds and/or with metal carboxylate bonds, the precursor solution having a viscosity from about 0.5 centipoises (cP) to about 150 cP. The organic liquid can have a flash point of at least 10° C. and a vapor pressure at 20° C. less than about 10 kPa.

BRIEF DESCRIPTION OF THE DRAWINGS

FIG. 1 is a schematic perspective view of a radiation patterned structure with a latent image.

FIG. 2 is a side plan view of the structure of FIG. 1.

FIG. 3 is a schematic perspective view of the structure of FIG. 1 after development of the latent image to remove un-irradiated coating material to form a patterned structure.

FIG. 4 is a side view of the patterned structure of FIG. 3.

FIG. 12A is a scanning electron micrograph of a negative tone patterned coating with 22 nm wide lines on a 44 nm pitch in a coating material formed with monobutyltin oxide hydrate following irradiation with EUV projection lithography with a 13.5 nm radiation at a dose of 101 mJ cm$^{-2}$ and developed with PGMEA.

FIG. 12B is a scanning electron micrograph of a negative tone patterned coating with 18 nm wide lines on a 36 nm pitch in a coating material formed with monobutyltin oxide hydrate following irradiation with EUV projection lithography with 13.5 nm radiation at a dose of 101 mJ cm$^{-2}$ and developed with PGMEA FIG. 13 is a plot of relative hydrocarbon concentration versus electron beam dose as calculated from FTIR transmission measurements of C—H stretching mode absorbance for a coating material formed with monobutyltin oxide hydrate.

FIG. 14 is a scanning electron micrograph of positive tone patterned coating with 30-nm wide lines and a 60 nm pitch in a coating material formed with monobutyltin oxide hydrate following irradiation with a 30 kV electron beam at a dose of 511 $\mu C/cm^2$ and development with 2.38% TMAH.

FIG. 15A is a scanning electron micrograph of negative-tone patterned coating with 18 nm wide lines on a 36 nm pitch and a line-width roughness (LWR) of 2.78 nm in a coating material formed with monobutyltin oxide hydrate following irradiation with a 30 kV electron beam at a dose of 1191 $\mu C/cm^2$ of a film that was deposited from a freshly prepared precursor solution and immediately exposed and developed in PGMEA.

FIG. 15B is a scanning electron micrograph of negative-tone patterned coating with 18 nm wide lines on a 36 nm pitch and a LWR of 2.87 nm in a coating material formed with monobutyltin oxide hydrate following irradiation with a 30 kV electron beam at a dose of 1191 $\mu C/cm^2$ of a film that was deposited from a precursor solution aged 39 days at room-temperature and then immediately exposed and developed in PGMEA.

FIG. 15C is a scanning electron micrograph of a negative-tone patterned coating with 18 nm wide lines on a 36 nm pitch and a LWR of 2.68 nm in a coating material formed with monobutyltin oxide hydrate following irradiation with a 30 kV electron beam at a dose of 1191 $\mu C/cm^2$ of a resist film that was deposited from a freshly prepared precursor solution and aged 39 days at room-temperature as a coated film then exposed and developed in PGMEA.

DETAILED DESCRIPTION OF THE INVENTION

Figure 5:
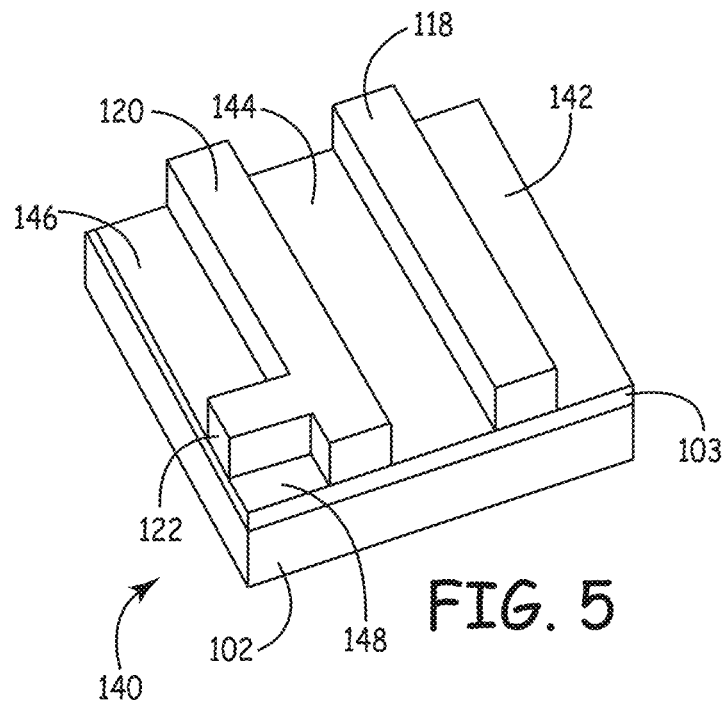
FIG. 5 is a schematic perspective view of the structure of FIG. 1 after development of the latent image to remove irradiated coating material to form a patterned structure.

Desirable organometallic precursor solutions, generally with non-aqueous solvents, with a ligand structure that provides for high resolution patterning in which the solutions have a high degree of stability for the formation of radiation patternable coatings with good radiation sensitivity. Desirable ligands for forming metal oxo/hydroxo complexes can comprise M-C bonds or M-O$_2$C bonds, where M is a selected metal atom, with particularly desirable results obtainable where M is tin, indium, antimony or a combination thereof. Desirable features of coatings formed with the organometallic precursor solutions provide for superior direct patterning for the formation of a patterned metal oxide coating. In embodiments of particular interest, exposure to radiation converts the irradiated coating material into a material that is resistant to removal with a developer composition, or exposure sufficiently changes the polarity of the coating material such that it can be selectively removed. Thus, in some embodiments, the coating can be either negatively patterned or positively patterned with the same coating. Selective removal of at least a portion of the coating material can leave a pattern where regions of coating have been removed to expose the underlying substrate. After development of the coting following irradiation, the patterned oxide materials can be used for facilitating processing in device formation with excellent pattern resolution. The coating materials can be designed to be sensitive to selected radiation, such as extreme ultraviolet light, ultraviolet light and/or electron beams. Furthermore, the precursor solutions can be formulated to be stable with an appropriate shelf life for commercial distribution.

To simplify the discussion herein, the metal ions with an M-C ligand bond and/or a M-$O_2$C ligand bonds can be referred to as organo-stabilized metal ions. The metal ions generally also are further bound to one or more oxo-ligands, i.e., M-O and/or hydroxo-ligands, i.e., M-O—H, in addition to the organic ligands. The organo-stabilizing ligands and the oxo/hydroxo ligands provide desirable features to precursor solution and corresponding coating by providing significant control over the condensation process to a metal oxide with resulting significant processing advantages. The use of organic solvents supports the stability of the solution, while surprisingly the non-aqueous solution based processing maintains the ability to selectively develop the resulting coating following the formation of a latent image with excellent development rate contrast, for both positive tone patterning and negative tone patterning. Desirable precursor solutions with dissolved organo-stabilized metal ions provide for convenient solution based deposition to form a coating that can have high radiation sensitivity and excellent contrast with respect to etch resistance to allow for fine structure formation. The design of the precursor composition can provide for the formation of a coating composition with a high sensitivity to a particular radiation type and/or energy/wavelength.

The radiation sensitive coating material can be used as either a positive radiation patterning coating or a negative radiation patterning coating. In the negative patterning, exposure to radiation converts the irradiated coating material into a material that is more resistant to removal with a developer composition relative to the non-irradiated coating material. In the positive patterning, exposure sufficiently changes the polarity of the exposed coating material, e.g., increasing the polarity, such that the exposed coating material can be selectively removed with an aqueous solvent or other highly polar solvent. Selectively removal of at least a portion of the coating material leaves a pattern where regions have been removed to expose the underlying substrate.

The formation of integrated electronic devices and the like generally involves the patterning of the materials to form individual elements or components within the structures. This patterning can involve different compositions covering selected portions of stacked layers that interface with each other vertically and/or horizontally to induce desired functionality. The various materials can comprise semiconductors, which can have selected dopants, dielectrics, electrical conductors and/or other types of materials. To form high resolution patterns, radiation sensitive organic compositions can be used to introduce patterns, and the compositions can be referred to as resists since portions of the composition are processed to be resistant to development/etching such that selective material removal can be used to introduce a selected pattern. Radiation with the selected pattern or the negative of the pattern can be used to expose the resist and to form a pattern or latent image with developer resistant regions and developer dissolvable regions. The radiation sensitive organometallic compositions described herein can be used for the direct formation of desired inorganic material structures within the device and/or as a radiation patternable inorganic resist that is a replacement for an organic resist. In either case, significant processing improvements can be exploited, and the structure of the patterned material can be also improved.

Specifically, the precursor solution can comprise sufficient radiation sensitive organic ligands such that the solution has a molar concentration ratio of radiation sensitive ligands to metal cations from about 0.1 to about 3. The coating formed from the precursor solution is influenced by the ligand structure of the ions in the precursor solution and may be an equivalent ligand structure around the metal upon drying or the ligand structure can be altered during the coating and/or drying process. In particular, the organic ligand concentrations provide for a surprisingly large improvement in the precursor stability and control in network formation with solutions formed with organic solvents, generally polar organic solvents. While not wanting to be limited by theory, the increase in the radiation sensitive ligand concentration evidently reduces agglomeration of the metal cations, with corresponding oxo-ligands and/or hydroxo-ligands, to stabilize the solution. Thus, the precursor solution can be stable relative to settling of solids without further stirring for at least one week and possibly for significantly longer periods of time, such as greater than a month. Due to the long stability times, the improved precursors have increased versatility with respect to potential commercial uses. The overall molar concentration can be selected to achieve a desired coating thickness and desired coating properties, which can be obtained consistent with desired stability levels. Ligands with metal-carbon or metal-carboxylate bonds provide desirable radiation sensitive ligands, and specific ligands include, for example, alkyl groups (e.g., methyl, ethyl, propyl, butyl, t-butyl), aryl groups (e.g., phenyl, benzyl), alkenyl groups (e.g., vinyl, allyl), carboxylate (e.g., acetate, propanoate, butanoate, benzoate) groups, or combinations thereof.

The polyatomic metal oxo/hydroxo cations with organic ligands can be selected to achieve the desired radiation absorption. In particular, indium and tin based coating materials exhibit good absorption of far ultraviolet light at a 193 nm wavelength and extreme ultraviolet light at a 13.5 nm wavelength. Table 1 lists optical constants (n=index of refraction and k=extinction coefficient) at selected wavelengths for a coating material formed from monobutyltin oxide hydrate and baked at 100° C.

TABLE 1

| Wavelength (nm) | n | k |
| --- | --- | --- |
| 193 | 1.75 | 0.211 |
| 248 | 1.79 | 0.0389 |
| 365 | 1.63 | 0 |
| 405 | 1.62 | 0 |
| 436 | 1.61 | 0 |

Some precursor solutions effectively incorporate a blend of additional metals to provide for desirable overall properties of the coating materials. The precursor solutions can comprise additional metal cations to increase the absorption of some radiation wavelengths of significance for lithography. The metal ion concentration can be selected to provide desired properties for the precursor solution, with more dilute solutions generally consistent with the formation of thinner coating materials, although coating properties also depend on the deposition technique.

The ligand structure of the precursor compositions are believed to provide the desirable stability of the precursor solutions as well as the radiation patterning function. In particular, it is believed that the absorption of radiation can provide for the disruption of the bonds between the metal and the organic ligands to create a differentiation of the composition at the irradiated and non-irradiated sections of the coated material. Thus, the compositional changes to form the improved precursor solutions also provide for improved development of the image. In particular, the irradiated coating material may result in a stable inorganic metal oxide material with a tunable response to the developer, e.g., through proper developer selection either positive or negative-tone images can be developed. In some embodiments, suitable developers include, for example, 2.38% TMAH, i.e., the semiconductor industry standard. The coating layers can be made thin without pattern loss during development from removing the coating material from regions where the coating material is intended to remain following development. Compared to conventional organic resists, the materials described herein have extremely high resistance to many etch chemistries for commercially relevant functional layers. This enables process simplification through avoidance of intermediate sacrificial inorganic pattern transfer layers that would otherwise be used to supplement the patterned organic resists with respect to the mask function. Also, the coating material can provide for convenient double patterning. Specifically, following a thermal treatment, patterned portions of the coating material are stable with respect to contact with many compositions including further precursor solutions. Thus, multiple patterning can be performed without removing previously deposited hard-mask or resist coating materials.

The patterned coating material can be subsequently removed after the patterned material is used as a mask to pattern desired functional materials. Alternatively, the resulting patterned material can be incorporated into the structure following appropriate stabilization through at least some condensation into an inorganic metal oxide material, as a component of ultimate device(s). If the patterned inorganic coating material is incorporated into the structure, for example as a stable dielectric layer, many steps of the processing procedure can be eliminated through the use of a direct patterning of the material with radiation. Alternatively, it has been found that very high resolution structures can be formed using thin inorganic coating materials exposed using short wavelength electromagnetic radiation and/or electron beams, and that line-width roughness can be reduced to very low levels for the formation of improved patterned structures.

The precursor solution comprises polynuclear metal oxo/hydroxo cations and organic ligands. Polynuclear metal oxo/hydroxo cations, also described as metal suboxide cations, are polyatomic cations with a metal element and covalently bonded oxygen atoms. Metal suboxide cations with peroxide based ligands are described in U.S. Pat. No. 8,415,000 to Stowers et al. (the '000 patent), entitled "Patterned Inorganic Layers, Radiation Based Patterning Compositions and Corresponding Methods," incorporated herein by reference. Aqueous solutions of metal suboxides or metal hydroxides can tend to be unstable with respect to gelling and/or precipitation. In particular, the solutions are unstable upon solvent removal and can form oxo-hydroxide networks with the metal cations. Incorporation of a radiation-sensitive ligand such as peroxide into such a solution can improve stability, but the background instability associated with network formation may persist. This uncontrolled network formation effectively decreases the radiation sensitivity and/or development rate contrast of the coated material by providing a development rate determining pathway independent of irradiation.

The new precursor solutions have been formulated with improved stability and control of network formation and precipitation relative to inorganic resist materials with peroxide based ligands. Characterization of ligands as radiation sensitive in this case refers to the lability of the metal-ligand bond following absorption of radiation, so that radiation can be used to induce a chemical change in the material. In particular, organic ligands stabilize the precursor solutions while also providing control over the processing of the materials, and selection of the ratio of organic ligands to metal ions can be adjusted to control properties of the solution and the resulting coatings. In particular, if the mole ratio of organic ligands to the metal cations is between about 0.1 and about 3, more stable solutions generally can be formed. The more stable precursor solutions provide an added advantage of greater contrast between the ultimate irradiated coating material and un-irradiated coating material since the rupture of the organic ligand bonds with the metal can be accomplished with radiation to improve development rate contrast in the coating material with the latent image.

Refined precursor solutions with greater stability also provide for a coating material having the potential of a greater development rate contrast between the radiation exposed and unexposed portions of the substrate, which surprisingly can be achieved simultaneously with either positive tone patterning or negative tone patterning. Specifically, the irradiated coating material or the un-irradiated coating material can be relatively more easily dissolved by suitable developer compositions. Thus, with the improved compositions and corresponding materials, positive- or negative-tone imaging can be achieved through choice of developer. At the same time, the pitch can be made very small between adjacent elements with appropriate isolation, generally electrical isolation, between the adjacent elements. The irradiated coating composition can be very sensitive to a subsequent development/etching process so that the coating composition can be made very thin without compromising the efficacy of the development process with respect to selective and clean removal of the coating composition while leaving appropriate portions of the irradiated patterning composition on the surface of the substrate. The ability to shorten the exposure time to the developer further is consistent with the use of thin coatings without damaging the patterned portions of the coating.

The precursor solutions can be deposited generally with any reasonable coating or printing technique as described further below. The coating generally is dried, and heat can be applied to stabilize the coating prior to irradiation. Generally, the coatings are thin, such as with an average thickness of less than 10 microns, and very thin submicron coatings can be desirable to pattern very small features. The dried coating can be subjected to appropriate radiation, e.g., extreme ultraviolet light, e-beam or ultraviolet light, to form a latent image in the coating. The latent image is contacted with the developer to form a physical image, i.e. a patterned coating. The patterned coating can be further heated to stabilize the remaining coating patterned on the surface. The patterned coating can be used as a physical mask to perform further processing, e.g., etching of the substrate and/or deposition of additional materials according to the pattern. At appropriate points of the processing, the remaining patterned coating can be removed, although the patterned coating can be incorporated into the ultimate structure. Very fine features can be accomplished effectively with the patterning compositions described herein.

Precursor Solutions

The precursor solutions for forming the resist coatings generally comprise metal cations with appropriate organic-stabilizing ligands in an organic solvent, generally an organic solvent. The precursor solutions and the ultimate resist coatings are based on metal oxide chemistry, and the organic solutions of metal polycations with organic ligands provide stable solutions with good resist properties. The ligands provide the radiation sensitivity, and the particular selection of ligands can influence the radiation sensitivity. In particular, the precursor solutions can be designed to achieve desired levels of radiation absorption for a selected radiation based on the selection of the metal cations as well as the associated ligands. The concentration of ligand stabilized metal cations in the solution can be selected to provide suitable solution properties for a particular deposition approach, such as spin coating. Metals of particular effectiveness with respect to stability and processing effectiveness are group 13, 14 and 15 metals. To correspondingly provide a high absorption of radiation generally used for patterning, it is desirable to include Sn, In and Sb metals in the precursor solutions, although these metals can be combined with other metals to adjust the properties, especially the radiation absorption. The precursor solutions have been formulated to achieve very high levels of stability such that the precursor solutions have appropriate shelf lives for commercial products. As described in the following section, the precursor solutions can be applied to a substrate surface, dried and further processed to form an effective radiation resist. The precursor solutions are designed to form a coating composition upon at least partial solvent removal and ultimately an inorganic solid dominated by metal oxides upon irradiation and/or thermal treatment, exposure to a plasma, or similar processing.

The precursor solutions generally comprise one or more metal cations. In aqueous solutions, metal cations are hydrated due to interactions with the water molecules, and hydrolysis can take place to bond oxygen atoms to the metal ion to form hydroxide ligands or oxo bonds with the corresponding release of hydrogen ions. The nature of the interactions is generally pH dependent. As additional hydrolysis takes place in aqueous solutions, the solutions can become unstable with respect to precipitation of the metal oxide or with respect to gelation. Ultimately, it is desirable to form the oxide material, but this progression can be controlled better with the precursor solutions based on organic solvents with organic ligand stabilized metal cations. With the precursor solutions based on organic-stabilization ligands and an organic solvent, progression to the oxide can be controlled as part of the procedure for processing the solution first to a coating material and then to the ultimate metal oxide composition with organic ligands. As described herein, organic ligands can be used to provide significant control to the processing of the solution to an effective radiation resist composition.

Thus, the solutions of the metal cations are poised for further processing. In particular, it can be desirous to use as an added component of the precursor solution, a polynuclear metal oxo/hydroxo cation that can poise the solution further toward a metal oxide composition. In general, the precursor solution comprises from about 0.01M to about 1.4M metal polynuclear oxo/hydroxo cation, in further embodiments from about 0.05M to about 1.2M, and in additional embodiments from about 0.1M to about 1.0M. A person of ordinary skill in the art will recognize that additional ranges of metal polynuclear oxo/hydroxo cations within the explicit ranges above are contemplated and are within the present disclosure.

Tin, antimony and/or indium are particularly suitable metals for formation of polynuclear metal oxo/hydroxo cations for the precursor solutions described herein. In particular, tin has a desirable chemistry based on organic ligands. Additional metals can be provided to produce more complex polynuclear metal oxo/hydroxo cation formulations, including, for example, Ti, Zr, Hf, V, Co, Mo, W, Al, Ga, Si, Ge, P, As, Y, La, Ce, Lu or combinations thereof. The additional metals can be as alternatives to or in addition to tin ions, antimony ions and/or indium ions (tin/antimony/indium ions). If blends of metal ions are used, in some embodiments the mole ratio of tin/antimony/indium with additional metal ion(s) can be up to about 1 non-tin/antimony/indium metal ion per each tin/antimony/indium ion and in further embodiments from about 0.1 to about 0.75 non-tin/indium metal ion per tin/antimony/indium metal ion. If blends of metal ions are used, the metal ions may be in complex multiple metal oxo-hydroxo clusters in solution or in distinct metal oxo-hydroxo clusters. The precise cluster form in solution may or may not be known, and the resulting coating generally can provide desired function whether or not the cluster structure in solution is known. As noted above, the state of the cations in solution is pH dependent, such that the initial state of oxygen coordination can change in solution, but the trend is toward hydrolysis and condensation leading to oxide formation. It has been found that organic ligands can hinder the formation of a metal-oxygen network that leads to gelation and ultimately precipitation. Thus, the organic ligand can be used to form a stable state that is poised for transformation to oxide through selective radiation exposures. The use of organic ligands also extends the choices of precursor solvents and developer to include both water-based and organic solvents.

The metal generally significantly influences the absorption of radiation. Therefore, the metal cations can be selected based on the desired radiation and absorption cross section. Indium and tin provide strong absorption of extreme ultraviolet light at 13.5 nm. In combination with organic ligands they also provide good absorption of ultraviolet light at 193 nm wavelength. Hf also provides good absorption of electron beam material and extreme UV radiation. Further tuning of the composition for radiation absorption can be adjusted based on the addition of other metal ions. For example, one or more metal compositions comprising Ti, V, Mo, or W or combinations thereof can be added to the precursor solution to form a coating material with an absorption edge moved to longer wavelengths, to provide, for example, sensitivity to 248 nm wavelength ultraviolet light. The energy absorbed is modulated by the metal-organic interactions, which can result in the rupturing of the metal-ligand and the desired control over the material properties.

The organic-based ligands stabilize the composition with respect to condensation. In particular, at high relative concentration of organic-based ligands, formation of condensed metal oxides or metal hydroxides are very slow if the condensation spontaneously occurs at all at room temperature. Based on the discovery of this stabilization property, solutions can be formed with high concentrations of radiation sensitive ligands that have good shelf stability while retaining convenient processing to form coatings. Radiation sensitive ligands include carboxylates and organic moieties forming a metal-carbon bond, e.g., tin-carbon bond. Energy from absorbed radiation can break the metal-organic ligand bond. As these bonds are broken, the corresponding stabilization with respect to condensation is reduced or lost. The composition can change through formation of M-OH or through condensation to form M-O-M bonds, where M represents a metal atom. Thus, chemical changes can be controlled with radiation. Compositions with high radiation sensitive ligand concentrations can be highly stable with respect to the avoidance of spontaneous formation of hydroxide and condensation. Some suitable metal compositions with desired ligand structures can be purchased from commercial sources, such as Alfa Aesar (MA, USA) and TCI America (OR, USA), see Examples below, and other metal-ligand compositions can be synthesized as described below.

The organic ligands can be, for example, alkyls (e.g., methyl, ethyl, propyl, butyl, t-butyl, aryl (phenyl, benzyl)), alkenyls (e.g., vinyl, allyl), and carboxylates (acetate, propanoate, butanoate benzoate). The precursor composition generally comprises a ligand concentration of from a factor of about 0.25 to about 4 times the metal cation concentration, in further embodiments from about 0.5 to about 3.5 in additional embodiments from about 0.75 to about 3, and in other embodiments from about 1 to about 2.75 times the metal cation concentration. A person of ordinary skill in the art will recognize that additional ranges of ligand concentrations within the explicit ranges above are contemplated and are within the present disclosure.

With respect to the oxo/hydroxo ligands for the metal ions, these ligands can be formed during processing through hydrolysis. In some embodiments, the hydrolysis can involve replacement of halide ligands in a basic aqueous solution with subsequent transfer to an organic solvent. A specific example is presented below. Basically, a composition comprising the metal ions with organic stabilizing ligands and halide ligands are dissolved in an organic solvent, which is then contacted with a basic aqueous solution, whereupon substitution of the halide ligands with hydroxo ligands may occur. After providing enough time to form hydroxo ligands, the aqueous solution can be separated from the organic phase assuming that the organic liquid is not soluble in the aqueous liquid. In some embodiments, the oxo/hydroxo ligands can be formed through hydrolysis from atmospheric water. The hydrolyzable metal ion composition can be heated in the presence of atmospheric moisture so that the oxo/hydroxo ligands form directly in the coating material, which can be relatively facile due to the high surface area. An example of hydrolysis from atmospheric water is also described below.

With respect to formation of the organo-stabilizing ligands, these can also be formed in solution to form desired compositions. With respect to the carboxylate ligands, the corresponding carboxylic acid or a salt thereof can be dissolved in solution with the metal cations. If desired the pH of the solution can be adjusted to facilitate bonding of the carboxylate groups to the metal, and heat may be applied to further drive the process. In general, the reaction can be performed in an aqueous solvent with subsequent transfer to an organic solvent or directly performed in an organic solvent. Also, M-C bonds can also be formed in a solution phase substitution reaction. The following reactions are representative suitable reactions for the substitution reactions to form Sn—C bonds, and similar reactions follow for other metal ions:

$$nRCl+Sn \rightarrow R_nSnCl_{4-n}+Residual$$

$$4RMgBr+SnCl_4 \rightarrow R_4Sn+4MgBrCl$$

$$3SnCl_4+4R_3Al \rightarrow 3R_4Sn+4AlCl_3$$

$$R_4Sn+SnCl_4 \rightarrow 2R_2SnCl_2,$$

Where R represents an organic ligand. Generally, different suitable halides can be substituted in the above reactions. The reactions can be carried out in a suitable organic solvent in which the reactants have reasonable solubility.

In general, the desired compounds can be dissolved in an organic solvent, e.g., alcohols, esters or combinations thereof. In particular, suitable solvents include, for example, aromatic compounds (e.g., xylenes, toluene), esters (propylene glycol monomethyl ether acetate, ethyl acetate, ethyl lactate), alcohols (e.g., 4-methyl-2-pentanol, 1-butanol, anisole), ketones (e.g., methyl ethyl ketone), and the like. In general, organic solvent selection can be influenced by solubility parameters, volatility, flammability, toxicity, viscosity and potential chemical interactions with other processing materials. After the components of the solution are dissolved and combined, the character of the species may change as a result of partial hydration and condensation, especially during the coating process. When the composition of the solution is referenced herein, the reference is to the components as added to the solution, since complex formulations may produce metal polynuclear species in solution that may not be well characterized. For certain applications it is desirable for the organic solvent to have a flash point of no less than about 10° C., in further embodiments no less than about 20° C. and in further embodiment no less than about 25° C. and a vapor pressure at 20° C. of no more than about 10 kPa, in some embodiments no more than about 8 kPa and in further embodiments no more than about 6 kPa. A person of ordinary skill in the art will recognize that additional ranges of flash point and vapor pressure within the explicit ranges above are contemplated and are within the present disclosure.

In general, precursor solutions are well mixed using appropriate mixing apparatuses suitable for the volume of material being formed. Suitable filtration can be used to remove any contaminants or other components that do not appropriately dissolve. In some embodiments, it may be desirable to form separate solutions that can be combined to form the precursor solution from the combination. Specifically, separate solutions can be formed comprising one or more of the following: the metal polynuclear oxo/hydroxo cations, any additional metal cations, and the organic ligands. If multiple metal cations are introduced, the multiple metal cations can be introduced into the same solution and/or in separate solutions. Generally, the separate solutions or the combined solutions can be well mixed. In some embodiments, the metal cation solution is then mixed with the organic-based ligand solution such that the organic-based ligand can conjugate with the metal cations. The resulting solution can be referred to as a stabilized metal cation solution. In some embodiments, the stabilized metal cation solution is allowed to react for a suitable period of time to provide for stable ligand formation, which may or may not also involve cluster formation in solution, whether or not mixed metal ions are introduced. In some embodiments, the reaction or stabilization time for the solution can be for at least about five minutes, in other embodiments at least about 1 hour, and in further embodiments from about 2 hours to about 48 hours prior to further processing. A person of ordinary skill in the art will recognize that additional ranges of stabilization periods are contemplated and are within the present disclosure.

The concentrations of the species in the precursor solutions can be selected to achieve desired physical properties of the solution. In particular, lower concentrations overall can result in desirable properties of the solution for certain coating approaches, such as spin coating, that can achieve thinner coatings using reasonable coating parameters. It can be desirable to use thinner coatings to achieve ultrafine patterning as well as to reduce material costs. In general, the concentration can be selected to be appropriate for the selected coating approach. Coating properties are described further below.

As noted above, a relatively large ratio of organic-based ligand relative to the metal cations can be used to greatly stabilize the precursor solutions. Stability of the precursor solutions can be evaluated with respect to changes relative to the initial solution. Specifically, a solution has lost stability if phase separation occurs with the production of large sol particles or if the solution loses its ability to perform desired pattern formation. Based on the improved stabilization approaches described herein, the solutions can be stable for at least about a week without additional mixing, in further embodiments at least about 2 weeks, in other embodiments at least about 4 weeks. A person of ordinary skill in the art will recognize that additional ranges of stabilization times are contemplated and are within the present disclosure. The solutions can be formulated with sufficient stabilization times that the solutions can be commercially distributed with appropriate shelf lives.

Coating Material

A coating material is formed through the deposition and subsequent processing of the precursor solution onto a selected substrate. A substrate generally presents a surface onto which the coating material can be deposited, and the substrate may comprise a plurality of layers in which the surface relates to an upper most layer. In some embodiments, the substrate surface can be treated to prepare the surface for adhesion of the coating material. Also, the surface can be cleaned and/or smoothed as appropriate. Suitable substrate surfaces can comprise any reasonable material. Some substrates of particular interest include, for example, silicon wafers, silica substrates, other inorganic materials, polymer substrates, such as organic polymers, composites thereof and combinations thereof across a surface and/or in layers of the substrate. Wafers, such as relatively thin cylindrical structures, can be convenient, although any reasonable shaped structure can be used. Polymer substrates or substrates with polymer layers on non-polymer structures can be desirable for certain applications based on their low cost and flexibility, and suitable polymers can be selected based on the relatively low processing temperatures that can be used for the processing of the patternable materials described herein. Suitable polymers can include, for example, polycarbonates, polyimides, polyesters, polyalkenes, copolymers thereof and mixtures thereof. In general, it is desirable for the substrate to have a flat surface, especially for high resolution applications.

In general, any suitable coating process can be used to deliver the precursor solution to a substrate. Suitable coating approaches can include, for example, spin coating, spray coating, dip coating, knife edge coating, printing approaches, such as inkjet printing and screen printing, and the like. Some of these coating approaches form patterns of coating material during the coating process, although the resolution available currently from printing or the like has a significantly lower level of resolution than available from radiation based patterning as described herein. The coating material can be applied in multiple coating steps to provide greater control over the coating process. For example, multiple spin coatings can be performed to yield an ultimate coating thickness desired. The heat processing described below can be applied after each coating step or after a plurality of coating steps.

If patterning is performed using radiation, spin coating can be a desirable approach to cover the substrate relatively uniformly, although there can be edge effects. In some embodiments, a wafer can be spun at rates from about 500 rpm to about 10,000 rpm, in further embodiments from about 1000 rpm to about 7500 rpm and in additional embodiments from about 2000 rpm to about 6000 rpm. The spinning speed can be adjusted to obtain a desired coating thickness. The spin coating can be performed for times from about 5 seconds to about 5 minutes and in further embodiments from about 15 seconds to about 2 minutes. An initial low speed spin, e.g. at 50 rpm to 250 rpm, can be used to perform an initial bulk spreading of the composition across the substrate. A back side rinse, edge bead removal step or the like can be performed with water or other suitable solvent to remove any edge bead. A person or ordinary skill in the art will recognize that additional ranges of spin coating parameters within the explicit ranges above are contemplated and are within the present disclosure.

The thickness of the coating generally can be a function of the precursor solution concentration, viscosity and the spin speed for spin coating. For other coating processes, the thickness can generally also be adjusted through the selection of the coating parameters. In some embodiments, it can be desirable to use a thin coating to facilitate formation of small and highly resolved features in the subsequent patterning process. For example, the coating materials after drying can have an average thickness of no more than about 10 microns, in other embodiments no more than about 1 micron, in further embodiments no more than about 250 nanometers (nm), in additional embodiments from about 1 nanometers (nm) to about 50 nm, in other embodiments from about 2 nm to about 40 nm and in some embodiments from about 3 nm to about 25 nm. A person of ordinary skill in the art will recognize that additional ranges of thicknesses within the explicit ranges above are contemplated and are within the present disclosure. The thickness can be evaluated using non-contact methods of x-ray reflectivity and/or ellipsometry based on the optical properties of the film. In general, the coatings are relatively uniform to facilitate processing. In some embodiments, the variation in thickness of the coating varies by no more than ±50% from the average coating thickness, in further embodiments no more than ±40% and in additional embodiments no more than about 25% relative to the average coating thickness. In some embodiments, such as high uniformity coatings on larger substrates, the evaluation of coating uniformity may be evaluated with a 1 centimeter edge exclusion, i.e., the coating uniformity is not evaluated for portions of the coating within 1 centimeter of the edge. A person of ordinary skill in the art will recognize that additional ranges within the explicit ranges above are contemplated and are within the present disclosure.

The coating process itself can result in the evaporation of a portion of the solvent since many coating processes form droplets or other forms of the coating material with larger surface areas and/or movement of the solution that stimulates evaporation. The loss of solvent tends to increase the viscosity of the coating material as the concentration of the species in the material increases. An objective during the coating process can be to remove sufficient solvent to stabilize the coating material for further processing. In general, the coating material can be heated prior to radiation exposure to further drive off solvent and promote densification of the coating material. The dried coating material may generally form a polymeric metal oxo/hydroxo network based on the oxo-hydroxo ligands to the metals in which the metals also have some organic ligands, or a molecular solid comprised of polynuclear metal oxo/hydroxo species with organic ligands.

The solvent removal process may or may not be quantitatively controlled with respect to specific amounts of solvent remaining in the coating material, and empirical evaluation of the resulting coating material properties generally can be performed to select processing conditions that are effective for the patterning process. While heating is not needed for successful application of the process, it can be desirable to heat the coated substrate to speed the processing and/or to increase the reproducibility of the process. In embodiments in which heat is applied to remove solvent, the coating material can be heated to temperatures from about 45° C. to about 250° C. and in further embodiments from about 55° C. to about 225° C. The heating for solvent removal can generally be performed for at least about 0.1 minute, in further embodiments from about 0.5 minutes to about 30 minutes and in additional embodiments from about 0.75 minutes to about 10 minutes. A person of ordinary skill in the art will recognize that additional ranges of heating temperature and times within the explicit ranges above are contemplated and are within the present disclosure. As a result of the heat treatment and densification of the coating material, the coating material can exhibit an increase in index of refraction and in absorption of radiation without significant loss of contrast.

Patterned Exposure and Patterned Coating Material

The coating material can be finely patterned using radiation. As noted above, the composition of the precursor solution and thereby the corresponding coating material can be designed for sufficient absorption of a desired form of radiation. The absorption of the radiation results in energy that can break the bonds between the metal and organic ligands so that at least some of the organic-based ligands are no longer available to stabilize the material. With the absorption of a sufficient amount of radiation, the exposed coating material condenses, i.e. forms an enhanced metal oxo/hydroxo network, which may involve water absorbed from the ambient atmosphere. The radiation generally can be delivered according to a selected pattern. The radiation pattern is transferred to a corresponding pattern or latent image in the coating material with irradiated areas and un-irradiated areas. The irradiated areas comprise chemically altered coating material, and the un-irradiated areas comprise generally the as-formed coating material. As noted below, very sharp edges can be formed upon development of the coating material with the removal of the un-irradiated coating material or alternatively with selective removal of the irradiated coating material.

Radiation generally can be directed to the coated substrate through a mask or a radiation beam can be controllably scanned across the substrate. In general, the radiation can comprise electromagnetic radiation, an electron beam (beta radiation), or other suitable radiation. In general, electromagnetic radiation can have a desired wavelength or range of wavelengths, such as visible radiation, ultraviolet radiation or x-ray radiation. The resolution achievable for the radiation pattern is generally dependent on the radiation wavelength, and a higher resolution pattern generally can be achieved with shorter wavelength radiation. Thus, it can be desirable to use ultraviolet light, x-ray radiation or an electron beam to achieve particularly high resolution patterns.

Following International Standard ISO 21348 (2007) incorporated herein by reference, ultraviolet light extends between wavelengths of greater than or equal 100 nm and less than 400 nm. A krypton fluoride laser can be used as a source for 248 nm ultraviolet light. The ultraviolet range can be subdivided in several ways under accepted Standards, such as extreme ultraviolet (EUV) from greater than or equal 10 nm to less than 121 nm and far ultraviolet (FUV) from greater than or equal to 122 nm to less than 200 nm A 193 nm line from an argon fluoride laser can be used as a radiation source in the FUV. EUV light has been used for lithography at 13.5 nm, and this light is generated from a Xe or Sn plasma source excited using high energy lasers or discharge pulses. Soft x-rays can be defined from greater than or equal 0.1 nm to less than 10 nm.

The amount of electromagnetic radiation can be characterized by a fluence or dose which is obtained by the integrated radiative flux over the exposure time. Suitable radiation fluences can be from about 1 $mJ/cm^2$ to about 150 $mJ/cm^2$, in further embodiments from about 2 $mJ/cm^2$ to about 100 $mJ/cm^2$, and in further embodiments from about 3 $mJ/cm^2$ to about 50 $mJ/cm^2$. A person of ordinary skill in the art will recognize that additional ranges of radiation fluences within the explicit ranges above are contemplated and are within the present disclosure.

With electron beam lithography, the electron beam generally induces secondary electrons which generally modify the irradiated material. The resolution can be a function at least in part of the range of the secondary electrons in the material in which a higher resolution is generally believed to result from a shorter range of the secondary electrons. Based on high resolution achievable with electron lithography using the inorganic coating materials described herein, the range of the secondary electrons in the inorganic material is limited. Electron beams can be characterized by the energy of the beam, and suitable energies can range from about 5 V to about 200 kV (kilovolt) and in further embodiments from about 7.5 V to about 100 kV. Proximity-corrected beam doses at 30 kV can range from about 0.1 microcoulombs per centimeter squared to about 5 millicoulombs per centimeter squared ($mC/cm^2$), in further embodiments from about 0.5 $\mu C/cm^2$ to about 1 $mC/cm^2$ and in other embodiments from about 1 $\mu C/cm^2$ to about 100 $\mu C/cm^2$. A person of ordinary skill in the art can compute corresponding doses at other beam energies based on the teachings herein and will recognize that additional ranges of electron beam properties within the explicit ranges above are contemplated and are within the present disclosure.

Based on the design of the coating material, there is a large contrast of material properties between the irradiated regions that have condensed coating material and the un-irradiated, coating material with substantially intact organic ligands. It has been found that the contrast can be improved with a post-irradiation heat treatment, although satisfactory results can be achieved in some embodiments without post-irradiation heat treatment. The post-exposure heat treatment seems to anneal the irradiated coating material to increase its condensation without significantly condensing the un-irradiated regions of coating material based on thermal breaking of the organic ligand-metal bonds. For embodiments in which a post irradiation heat treatment is used, the post-irradiation heat treatment can be performed at temperatures from about 45° C. to about 250° C., in additional embodiments from about 50° C. to about 190° C. and in further embodiments from about 60° C. to about 175° C. The post exposure heating can generally be performed for at least about 0.1 minute, in further embodiments from about 0.5 minutes to about 30 minutes and in additional embodiments from about 0.75 minutes to about 10 minutes. A person of ordinary skill in the art will recognize that additional ranges of post-irradiation heating temperature and times within the explicit ranges above are contemplated and are within the present disclosure. This high contrast in material properties further facilitates the formation of sharp lines in the pattern following development as described in the following section.

Following exposure with radiation, the coating material is patterned with irradiated regions and un-irradiated regions. Referring to FIGS. 1 and 2, a patterned structure 100 is shown comprising a substrate 102, a thin film 103 and patterned coating material 104. Patterned coating material 104 comprises regions 110, 112, 114, 116 of irradiated coating material and uncondensed regions 118, 120 of un-irradiated coating material. The patterned formed by condensed regions 110, 112, 114, 116 and uncondensed regions 118, 120, 122 represent a latent image in to the coating material, and the development of the latent image is discussed in the following section.

Development and Patterned Structure

Development of the image involves the contact of the patterned coating material including the latent image to a developer composition to remove either the un-irradiated coating material to form the negative image or the irradiated coating to form the positive image. Using the resist materials described herein, effective negative patterning or positive patterning can be performed with desirable resolution using appropriate developing solutions, generally based on the same coating. In particular, the irradiated regions are at least partially condensed to increase the metal oxide character so that the irradiated material is resistant to dissolving by organic solvents while the un-irradiated compositions remain soluble in the organic solvents. Reference to a condensed coating material refers to at least partial condensation in the sense of increasing the oxide character of the material relative to an initial material. On the other hand, the un-irradiated material is not soluble in weak aqueous bases or acids due to the hydrophobic natural of the material so that aqueous bases can be used to remove the irradiated material while maintaining the non-irradiated material for positive patterning.

The coating compositions with organic-stabilization ligands produce a material that is inherently relatively hydrophobic. Irradiation to break at least some of the organic metal bonds converts the material into a less hydrophobic, i.e., more hydrophilic, material. This change in character provides for a significant contrast between the irradiated coating and non-irradiated coating that provides for the ability to do both positive tone patterning and negative tone patterning with the same resist composition. Specifically, the irradiated coating material condenses to some degree into a more of a metal oxide composition; however, the degree of condensation generally is moderate without significant heating so that the irradiated material is relatively straightforward to develop with convenient developing agents. In contrast, inorganic resist materials based on metal oxo-hydroxo chemistry with peroxide stabilization ligands, as described in the '000 patent cited above, are inherently more hydrophilic prior to irradiation, and the irradiated peroxide-based coatings can be condensed to a more significant degree by irradiation so that the un-irradiated resist can be removed with weak acids or bases while the irradiated peroxide-based coatings can be developed similar to a metal oxide material.

Figure 6:
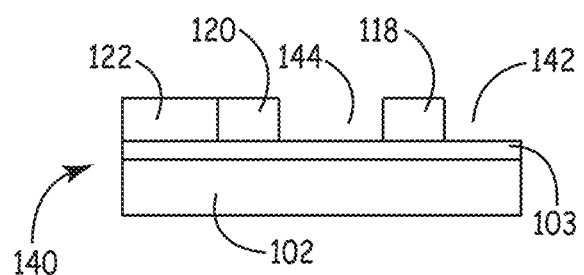
FIG. 6 is a side view of the patterned structure of FIG. 5.

With respect to negative tone imaging, referring to FIGS. 3 and 4, the latent image of the structure shown in FIGS. 1 and 2 has been developed through contact with a developer to form patterned structure 130. After development of the image, substrate 102 is exposed along the top surface through openings 132, 134. Openings 132, 134 are located at the positions of uncondensed regions 118, 120, respectively. With respect to positive tone imaging, referring to FIGS. 5 and 6, the latent image of the structure shown in FIGS. 1 and 2 has been developed to form patterned structure 140. Patterned structure 140 has the conjugate image of patterned structure 130. Patterned structure 140 has substrate 102 exposed at positions of irradiated regions 110, 112, 114, 116 that are developed to form openings 142, 144, 146, 148.

For the negative tone imaging, the developer can be an organic solvent, such as the solvents used to form the precursor solutions. In general, developer selection can be influenced by solubility parameters with respect to the coating material, both irradiated and non-irradiated, as well as developer volatility, flammability, toxicity, viscosity and potential chemical interactions with other process material. In particular, suitable developers include, for example, aromatic compounds (e.g., benzene, xylenes, toluene), esters (e.g., propylene glycol monomethyl ester acetate, ethyl acetate, ethyl lactate, n-butyl acetate, butyrolactone), alcohols (e.g., 4-methyl-2-pentanol, 1-butanol, isopropanol, anisole), ketones (e.g., methyl ethyl ketone, acetone, cyclohexanone), ethers (e.g., tetrahydrofuran, dioxane) and the like. The development can be performed for about 5 seconds to about 30 minutes, in further embodiments from about 8 seconds to about 15 minutes and in addition embodiments from about 10 seconds to about 10 minutes. A person of ordinary skill in the art will recognize that additional ranges within the explicit ranges above are contemplated and are within the present disclosure.

For positive tone imaging, the developer generally can be aqueous acids or bases. In some embodiments, aqueous bases can be used to obtain sharper images. To reduce contamination from the developer, it can be desirable to use a developer that does not have metal atoms. Thus, quaternary ammonium hydroxide compositions, such as tetraethylammonium hydroxide, tetrapropylammonium hydroxide, tetrabutylammonium hydroxide or combinations thereof, are desirable as developers. In general, the quaternary ammonium hydroxides of particular interest can be represented with the formula $R_4NOH$, where R=a methyl group, an ethyl group, a propyl group, a butyl group, or combinations thereof. The coating materials described herein generally can be developed with the same developer commonly used presently for polymer resists, specifically tetramethyl ammonium hydroxide (TMAH). Commercial TMAH is available at 2.38 weight percent, and this concentration can be used for the processing described herein. Furthermore, mixed quaternary tetraalkyl-ammonium hydroxides can be used. In general, the developer can comprise from about 0.5 to about 30 weight percent, in further embodiments from about 1 to about 25 weight percent and in other embodiments from about 1.25 to about 20 weight percent tetraalkylammonium hydroxide or similar quaternary ammonium hydroxides. A person of ordinary skill in the art will recognize that additional ranges of developer concentrations within the explicit ranges above are contemplated and are within the present disclosure.

In addition to the primary developer composition, the developer can comprise additional compositions to facilitate the development process. Suitable additives include, for example, dissolved salts with cations selected from the group consisting of ammonium, d-block metal cations (hafnium, zirconium, lanthanum, or the like), f-block metal cations (cerium, lutetium or the like), p-block metal cations (aluminum, tin, or the like), alkali metals (lithium, sodium, potassium or the like), and combinations thereof, and with anions selected from the group consisting of fluoride, chloride, bromide, iodide, nitrate, sulfate, phosphate, silicate, borate, peroxide, butoxide, formate, ethylenediamine-tetraacetic acid (EDTA), tungstate, molybdate, or the like and combinations thereof. Other potentially useful additives include, for example, molecular chelating agents, such as polyamines, alcohol amines, amino acids or combinations thereof. If the optional additives are present, the developer can comprise no more than about 10 weight percent additive and in further embodiments no more than about 5 weight percent additive. A person of ordinary skill in the art will recognize that additional ranges of additive concentrations within the explicit ranges above are contemplated and are within the present disclosure. The additives can be selected to improve contrast, sensitivity and line width roughness. The additives in the developer can also inhibit formation and precipitation of metal oxide particles.

With a weaker developer, e.g., lower concentration aqueous developer, diluted organic developer or compositions in which the coating has a lower development rate, a higher temperature development process can be used to increase the rate of the process. With a stronger developer, the temperature of the development process can be lower to reduce the rate and/or control the kinetics of the development. In general, the temperature of the development can be adjusted between the appropriate values consistent with the volatility of the solvents. Additionally, developer with dissolved coating material near the developer-coating interface can be dispersed with ultrasonication during development.

The developer can be applied to the patterned coating material using any reasonable approach. For example, the developer can be sprayed onto the patterned coating material. Also, spin coating can be used. For automated processing, a puddle method can be used involving the pouring of the developer onto the coating material in a stationary format. If desired spin rinsing and/or drying can be used to complete the development process. Suitable rinsing solutions include, for example, ultrapure water, methyl alcohol, ethyl alcohol, propyl alcohol and combinations thereof for negative patterning and ultrapure water for positive patterning. After the image is developed, the coating material is disposed on the substrate as a pattern.

After completion of the development step, the coating materials can be heat treated to further condense the material and to further dehydrate the material. This heat treatment can be particularly desirable for embodiments in which the oxide coating material is incorporated into the ultimate device, although it may be desirable to perform the heat treatment for some embodiments in which the coating material is used as a resist and ultimately removed if the stabilization of the coating material is desirable to facilitate further patterning. In particular, the bake of the patterned coating material can be performed under conditions in which the patterned coating material exhibits desired levels of etch selectivity. In some embodiments, the patterned coating material can be heated to a temperature from about 100° C. to about 600° C., in further embodiments from about 175° C. to about 500° C. and in additional embodiments from about 200° C. to about 400° C. The heating can be performed for at least about 1 minute, in other embodiment for about 2 minutes to about 1 hour, in further embodiments from about 2.5 minutes to about 25 minutes. The heating may be performed in air, vacuum, or an inert gas ambient, such as Ar or $N_2$. A person of ordinary skill in the art will recognize that additional ranges of temperatures and time for the heat treatment within the explicit ranges above are contemplated and are within the present disclosure.

With conventional organic resists, structures are susceptible to pattern collapse if the aspect ratio, height divided by width, of a structure becomes too large. Pattern collapse can be associated with mechanical instability of a high aspect ratio structure such that forces, e.g., surface tension, associated with the processing steps distort the structural elements. Low aspect ratio structures are more stable with respect to potential distorting forces. With the patternable coating materials described herein, due to the ability to process effectively the structures with thinner layers of coating material, improved patterning can be accomplished without the need for high aspect ratio patterned coating material. Thus, very high resolution features have been formed without resorting to high aspect ratio features in the patterned coating material.

The resulting structures can have sharp edges with very low line-width roughness. In particular, in addition to the ability to reduce line-width roughness, the high contrast also allows for the formation of small features and spaces between features as well as the ability to form very well resolved two-dimensional patterns (e.g., sharp corners). Thus, in some embodiments, adjacent linear segments of neighboring structures can have an average pitch of no more than about 60 nm, in some embodiments no more than about 50 nm and in further embodiments no more than about 40 nm. Pitch can be evaluated by design and confirmed with scanning electron microscopy (SEM), such as with a top-down image. As used herein, pitch refers to the spatial period, or the center-to-center distances of repeating structural elements. Feature dimensions of a pattern can also be described with respect to the average width of the feature, which is generally evaluated away from corners or the like. Also, features can refer to gaps between material elements and/or to material elements. In some embodiments, average widths can be no more than about 30 nm, in further embodiments no more than about 25 nm, and in additional embodiments no more than about 20 nm. Average line-width roughness can be no more than about 3.0 nm, and in further embodiments from about 1.5 nm to about 2.5 nm. Evaluating line-width roughness is performed by analysis of top-down SEM images to derive a 3σ deviation from the mean line-width. The mean contains both high-frequency and low-frequency roughness, i.e., short correlation lengths and long correlation lengths, respectively. The line-width roughness of organic resists is characterized primarily by long correlation lengths, while the present inorganic coating materials exhibit significantly shorter correlation lengths. In a pattern transfer process, short correlation roughness can be smoothed during the etching process, producing a much higher fidelity pattern. A person of ordinary skill in the art will recognize that additional ranges of pitch, average widths and line-width roughness within the explicit ranges above are contemplated and are within the present disclosure.

Further Processing of Patterned Coating Material

After forming a patterned coating material, the coating material can be further processed to facilitate formation of the selected devices. Furthermore, further material deposition, etching and/or patterning generally can be performed to complete structures. The coating material may or may not ultimately be removed. The quality of the patterned coating material can in any case be carried forward for the formation of improved devices, such as devices with smaller foot prints and the like.

Figure 7:
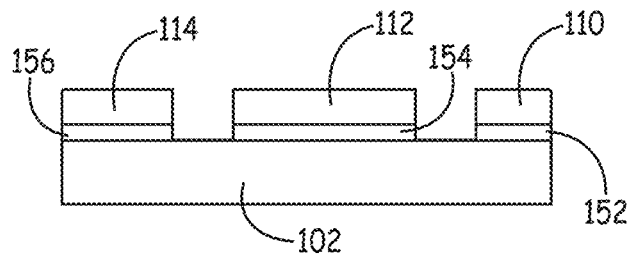
FIG. 7 is a side plan view of the patterned structure of FIGS. 3 and 4 following etching of the underlayer.

The patterned coating material forms openings to the underlying substrate, as shown for example in FIGS. 3 and 4. As with conventional resists, the patterned coating material forms an etch mask which can be used to transfer the pattern to selectively remove an underlying thin film. Referring to FIG. 7, underlying thin film 103 is patterned leaving features 152, 154, 156 respectively under condensed regions 110, 112, 114. Compared with conventional polymer resists, the materials described herein can provide significantly greater etch resistance. Similar processing can be undertaken with the mask pattern shown in FIGS. 5 and 6 with corresponding shifting of the patterned structures that follow directly from the alternative mask pattern.

Alternatively or additionally, the deposition of a further material according to the mask pattern can alter the properties of the underlying structure and/or provide contact to the underlying structure. The further coating material can be selected based on the desired properties of the material. In addition, ions can be selectively implanted into the underlying structure through openings in the mask, as the density of the patterned inorganic coating material can provide a high implant resistance. In some embodiments, the further deposited material can be a dielectric, a semiconductor, a conductor or other suitable material. The further deposited material can be deposited using suitable approaches, such as solution based approaches, chemical vapor deposition (CVD), sputtering, physical vapor deposition (PVD), or other suitable approach.

In general, a plurality of additional layers can be deposited. In conjunction with the deposition of a plurality of layers, additional patterning can be performed. Any additional patterning, if performed, can be performed with additional quantities of the coating materials described herein, with polymer-based resists, with other patterning approaches or a combination thereof.

As noted above, a layer of coating (resist) material following patterning may or may not be removed. If the layer is not removed, the patterned coating (resist) material is incorporated into the structure. For embodiments in which the patterned coating (resist) material is incorporated into the structure, the properties of the coating (resist) material can be selected to provide for desired patterning properties as well as also for the properties of the material within the structure.

Figure 8:
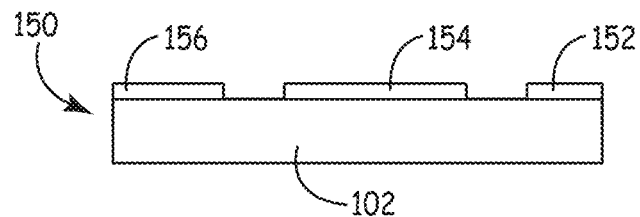
FIG. 8 is a side plan view of the structure of FIG. 7 following etching to remove the patterned, condensed coating material.

If it is desired to remove the patterned coating material, the coating material functions as a conventional resist. The patterned coating material is used to pattern a subsequently deposited material prior to the removal of the resist/coating material and/or to selectively etch the substrate through the spaces in the condensed coating material. The condensed coating material can be removed using a suitable etching process. Specifically, to remove the condensed coating material, a dry etch can be performed, for example, with a $BCl_3$ plasma, $Cl_2$ plasma, HBr plasma, Ar plasma or plasmas with other appropriate process gases. Alternatively or additionally, a wet etch with, for example, an aqueous acid or base, such as HF(aq), or buffered HF(aq)/$NH_4F$ or oxalic acid can be used to remove the patterned coating material. Referring to FIG. 8, the structure of FIG. 8 is shown after removal of the coating material. Etched structure 150 comprises substrate 102 and features 152, 154, 156.

Figure 9:
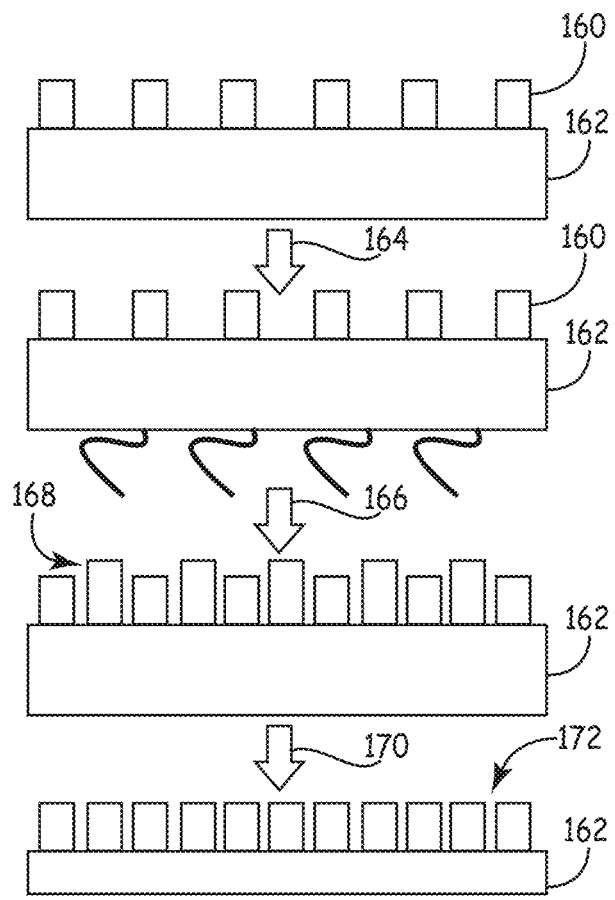
FIG. 9 is a side plan view of a "thermal freeze" double patterning process flow. The process shown in FIGS. 1-3 is repeated after a bake that renders the first layer insoluble to the second layer.

The metal oxo/hydroxo based coating materials are particularly convenient for performing multiple patterning using a thermal freeze process, as described generally with conventional resists in P. Zimmerman, J. Photopolym. Sci. Technol., Vol. 22, No. 5, 2009, p. 625. A double patterning process with a "thermal freeze" is outlined in FIG. 9. In the first step, the coating material is formed into a pattern 160 on substrate 162 using a lithographic process and development as described with respect to FIGS. 3 and 4. A heating step 164 is performed to remove solvent and condense the coating material, which may or may not involve full oxide formation. This heating step is equivalent to the post-development heating step described in the Development section above. This "thermal freeze" process makes the coating material insoluble to a subsequent deposition of a second layer of the coating material. A second lithographic and development step 166 is performed to form a double patterned structure 168 on substrate 162. After an etch step 170, the product double patterned structure 172 is formed. Note that it is straightforward to extend this process to multiple coat and pattern steps, and such extensions are contemplated and are within the present disclosure. With respect to multiple patterning, a significant difference between the inorganic coating materials described herein and conventional organic resists is that organic resists remain soluble in conventional resist casting solvents even after a thermal bake. The resist materials described herein can be condensed with a thermal bake such that they are not soluble in organic solvents and subsequent coating layers can be applied.

EXAMPLES

Example 1—Preparation of Precursor Solutions

This example described preparation of precursor solutions for the deposition of Tin based organometallic compositions for the formation of a radiation resist coating.

Figure 10A:
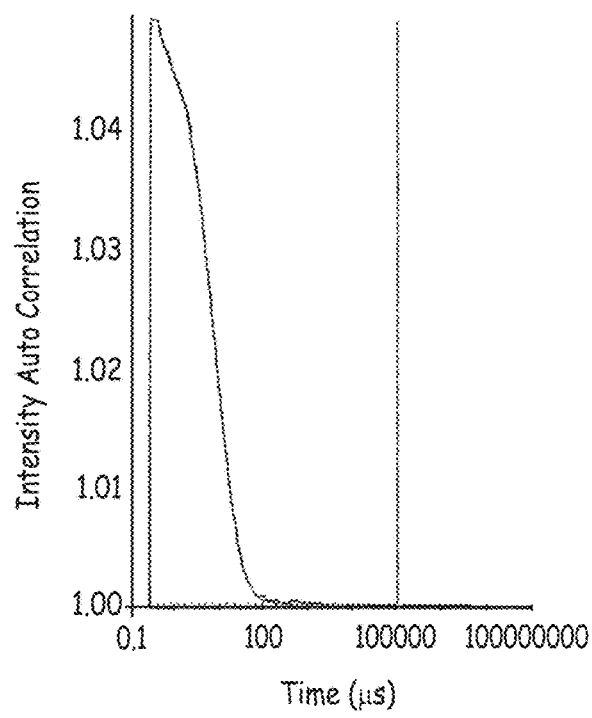
FIG. 10A is a plot of the autocorrelation scattering intensity decay versus time of a precursor solution with monobutyltin oxide hydrate.
Figure 10B:
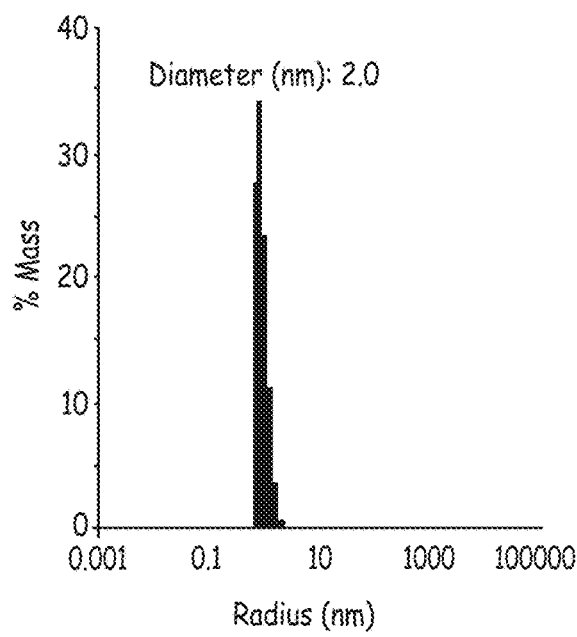
FIG. 10B is a histogram of the calculated mass averaged particle size distribution of a precursor solution comprising monobutyltin oxide hydrate in 4-methyl-2-pentanol.
Figure 11A:
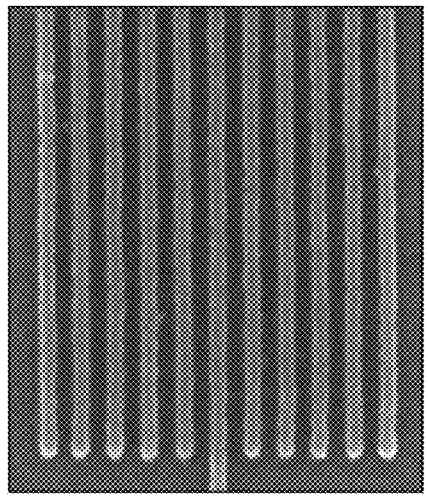
FIG. 11A is a scanning electron micrograph of negative tone patterned coating with 18 nm wide lines on a 36 nm pitch in a coating material formed with monobutyltin oxide hydrate following irradiation with a 30 kV electron beam at a dose of 1191 $\mu C/cm^2$, and developed in 4-methyl-2-pentanol.
Figure 11B:
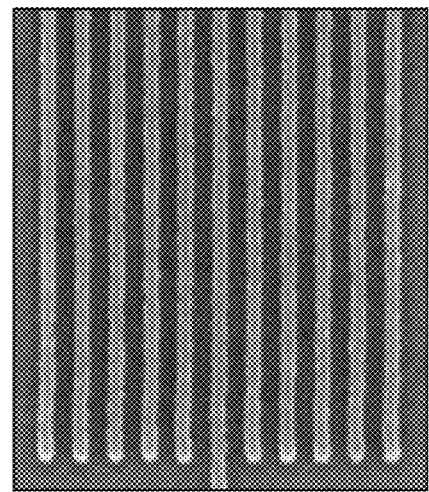
FIG. 11B is a scanning electron micrograph of negative tone patterned coating with 18 nm wide lines on a 36 nm pitch in a coating material formed with monobutyltin oxide hydrate following irradiation with a 30 kV electron beam at a dose of $1191/\mu cm^2$, and developed in ethyl lactate.
Figure 11C:
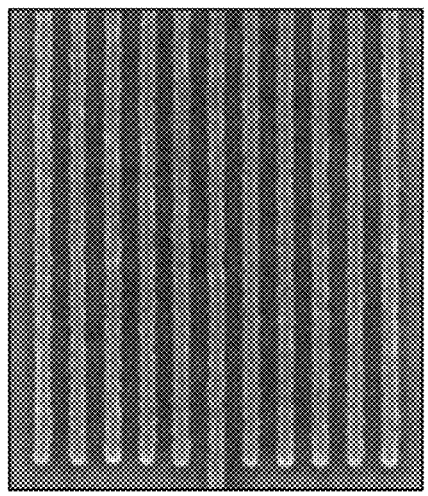
FIG. 11C is a scanning electron micrograph of negative tone patterned coating with 18 nm wide lines on a 36 nm pitch in a coating material formed with monobutyltin oxide hydrate following irradiation with a 30 kV electron beam at a dose of 1191 $\mu C/cm^2$, and developed in propylene glycol monomethyl ether (PGMEA).
Figure 11D:
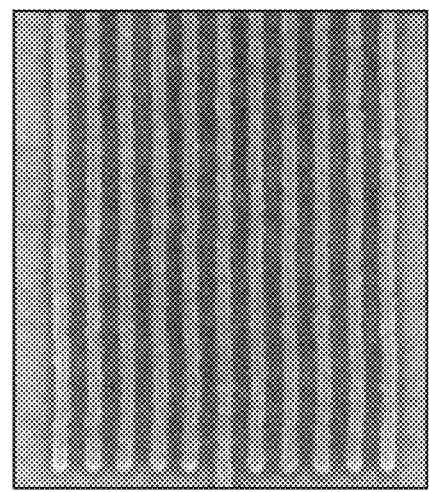
FIG. 11D is a scanning electron micrograph of negative tone patterned coating with 18 nm wide lines on a 36 nm pitch in a coating material formed with monobutyltin oxide hydrate following irradiation with a 30 kV electron beam at a dose of 1191 $\mu C/cm^2$, and developed in n-butyl acetate.

A resist precursor solution was prepared by adding 0.209 g monobutyltin oxide hydrate (BuSnOOH) powder (TCI America) to 10 mL of 4-methyl-2-pentanol. The solution was placed in a closed vial and allowed to stir for 24 h. The resulting mixture was centrifuged at 4000 rpm for 15 minutes, and filtered through a 0.45 µm PTFE syringe filter to remove insoluble material. Solvent evaporation and calcination of this sample at 600° C. revealed a tin concentration of 0.093 M on the basis of $SnO_2$ residual mass. Dynamic light scattering (DLS) analysis with a Möbius apparatus (Wyatt Technology) of the precursor solution (FIG. 10) is consistent with a monomodal distribution of particles with a mean diameter of ~2 nm, consistent with the reported diameter (Eychenne-Baron et al., Organometallics, 19, 1940-1949 (2000)) of dodecameric butyltin hydroxide oxide polyatomic cations. Thus, the results are consistent with cluster formation within the non-aqueous solutions.

Example 2—Resist Coating, Film Processing, Negative Tone Imaging

This example demonstrates the formation of a resist pattern based on negative tone imaging based on e-beam exposure or extreme ultraviolet exposure.

Silicon wafers (25×25 mm square) with a native-oxide surface were used as substrates for thin-film deposition. Si substrates were treated with a 10 minute cycle in an Ultra-Violet Ozone cleaning system before deposition. The resist precursor solution from Example 1 was then spin-coated on the substrate at 4500 rpm for 30 s and baked on a hotplate for 2 min at 100° C. to remove residual solvent. Film thickness following coating and baking was measured via ellipsometry to be ~22 nm.

A first substrate coated with a resist film was exposed to a 30-kV electron-beam rastered to form a pattern with a dose of 1100 μC/cm$^2$. The patterned resist and substrate were then subjected to a post-exposure bake (PEB) for 2 min at 150° C. The exposed film was then dipped in a polar organic solvent for 30 seconds and rinsed with in DI H$_2$O to form a negative tone image with unexposed portions of the coating removed. A final 5-min hotplate bake at 200° C. was performed after development. FIG. 11 exhibits SEM images of 18-nm lines on a 36-nm pitch in resist film developed in 4-methyl-2-pentanol (a), ethyl lactate (b), propylene glycol monomethyl ether (PGMEA) (c), and n-butyl acetate (d).

Another substrate was prepared with the identical precursor solution and coating/baking processes were used prior to exposure to extreme ultraviolet radiation, which is similarly suitable for high-resolution patterning. A pattern of 22 and 18-nm lines on 44 and 36-nm pitches, respectively, were exposed on the resist using projection with a numerical aperture of 0.3 operating at 13.5 nm wavelength and an imaging dose of 101 mJ/cm$^2$. After a 2-min, 165° C. hotplate PEB, the film was developed by immersion in PGMEA, rinsed with DI H$_2$O, and baked a final time for 5 min at 200° C. Negative images of the well-resolved line-space patterns are shown in FIG. 12.

The chemical contrast generated upon radiation exposure that induces the polarity change revealed in development rate contrast and resist imaging performance is clearly illustrated with Fourier transform infrared (FTIR) spectroscopy. Transmission mode FTIR spectra of a butyltin hydroxide oxide resist film spin-coated on an un-doped Silicon wafer from a tetrahydrofuran (THF) solvent were collected as a function of exposure dose with a 30 kV electron beam. Analysis of several absorption peaks corresponding to Alkyl C—H stretching modes from 2800-2900 cm$^{-1}$ indicates a consistent decrease in the concentration of the alkyl ligand as a function of dose (FIG. 13).

Example 3—Positive Tone Imaging

This example demonstrated the formation of a positive tone image using the resist solution from Example 1.

Another substrate was coated with a resist film deposited from an identical precursor solution from Example 1 and baked on a hotplate at 150° C. for 2 min. The based wafer with the resist coating was exposed with an electron beam at 30 kV with a dose of 511 μC/cm$^2$, followed by a 2-min, 150° C. post exposure bake. Positive tone imaging was achieved by developing the exposed resist film in an aqueous base such as 2.38% tetramethyl ammonium hydroxide (TMAH). Immersion in 2.38% TMAH etched the exposed resist, developing the 30-nm (60 nm pitch) lines shown the SEM image in FIG. 14.

Example 4—Resist Stability

This example demonstrates resist precursor stability by consistent imaging performance of a resist precursor solution and coated film following aging.

A resist precursor solution prepared as previously described in Example 1 was applied via spin coating to a pair of wafer substrates, which were baked on a hotplate for 2 min at 100° C. A portion of the precursor solution was retained in a sealed vial and stored with one of the coated substrates (first substrate) in the dark, at uncontrolled room-temperature (20-30° C.) under an atmospheric ambient. Immediately following coating, the second substrate with a resist film was successively patterned with a 30-kV electron beam, baked at 150° C. for 2 min, developed for 30 s in PGMEA, rinsed, and hard baked at 200° C. for 2 min. An SEM image of the resulting patterned second substrate is shown in FIG. 15A. This exposure and development process was repeated on the stored first substrate with the resist film 39 days later. An SEM image of the patterned first substrate is shown in FIG. 15B. Likewise, the retained portion of the original precursor solution was used on the same day after 39 days of storage to coat a third wafer substrate with a resist film, which was immediately processed, exposed, and developed identically to the first two substrates. An SEM image of the patterned third substrate is shown in FIG. 15C. The imaging performance of the three resist films on the same 36 nm pitch and 18 nm line width is found to be functionally identical, with no observable degradation in image fidelity, LWR, or sensitivity after aging of the coated resist film or precursor solution over a 39-day period.

Example 5—Radiation Sensitivity Modulation Based On Organic Ligand Selection

This example demonstrates that modulation in resist radiation sensitivity is observed by selecting appropriate organic ligands.

Divinyltin dichloride (Alpha Aesar) was dissolved in PGMEA to a concentration of 0.1 M. A 15 mL quantity of this solution was placed in a separatory funnel, to which was added 7.31 mL of 0.4 M NaOH (aq). Immediately following NaOH addition, the vessel was shaken thoroughly for ~1 minute, and the resulting emulsion was allowed to separate for ~24 h. During this period, a light flocculate formed at the phase interface between the two media was observed to dissipate, and two clear phases were obtained. The lower aqueous phase was removed from the funnel and the upper, PGMEA, phase was shaken over a 4A molecular sieve (Mallinkrodt, Grade 514) for ~5 minutes to remove residual water. Solvent evaporation and calcination of an aliquot of the sieved composition disclosed a tin concentration of 0.1 M on the basis of the residual mass SnO$_2$.

Figure 16:
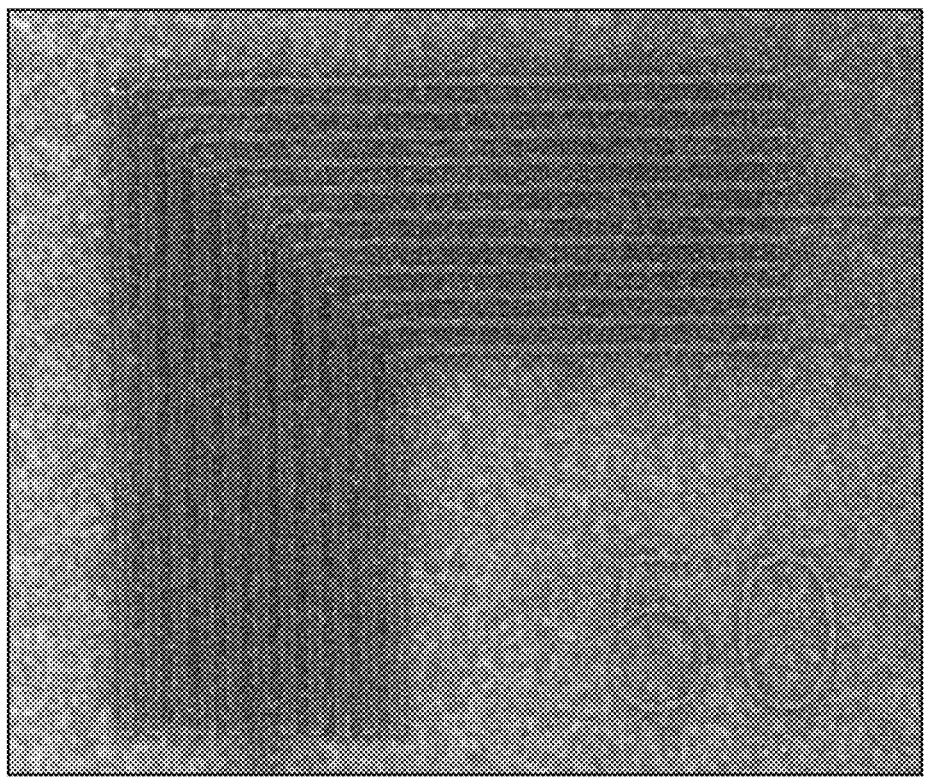
FIG. 16 is a scanning electron micrograph of a negative-tone patterned coating with lines on a 100 nm pitch in a coating formed with a divinyltin hydroxide/oxide coating material following irradiation with a 30 kV electron beam at a dose of 75 $\mu C/cm^2$ and developed in PGMEA.

The preceding divinyltin hydroxide solution in PGMEA following separation and sieving was directly spin-cast on a silicon wafer at 1250 rpm and subjected to a 100° C. hotplate bake for 2 min. Ellipsometric measurement post-baking indicated a resist film thickness of ~16 nm. The resist film was exposed with 30 kV electron beam at a dose of 75 μC/cm$^2$ followed by a second hotplate bake at 100° C., and development in PGMEA. An SEM image of a negative tone line/space pattern on a 100 nm pitch is displayed in FIG. 16. Note that the electron beam dose used to generate FIG. 16 was significantly less than used in Examples 2 and 3.

Figure 17:
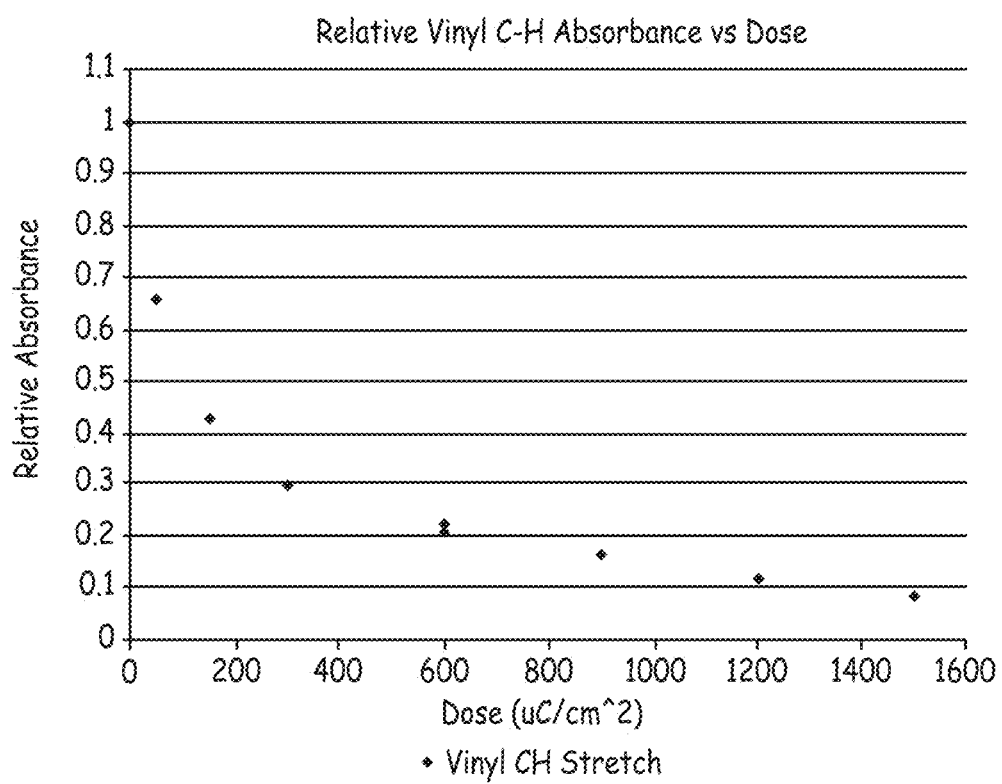
FIG. 17 is a plot of relative vinyl (C—H stretch) absorbance versus dose as calculated from FTIR transmission spectra of a coating formed with divinyltin hydroxide/oxide coating materials exposed with a 30 kV electron beam.

Transmission-mode FTIR spectra were collected on similar resist films deposited from an ethyl acetate solvent on undoped silicon wafers as a function of dose. The relative IR absorption as a function of electron beam dose is plotted in FIG. 17. Based on an analysis of the area of an absorption peak consistent with the vinyl C—H stretch centered at ~3055 l/cm, a drop in the area indicates the loss of vinyl groups as tin ligands on exposure that is much more rapid and comprehensive with respect to dose than the loss of alkyl ligands in the butyltin hydroxide oxide case shown in FIG. 13.

Example 6—Organotin Oxo-Carboxylate Resist

This example demonstrates the effectiveness of a radiation resist formed with alkyl and carboxylate ligands for tin ions.

A resist precursor solution was prepared by dissolving dibutyltin diacetate (Alfa-Aesar) in n-propanol to a final concentration of 0.025 M. The solution was then filtered through a 0.45 μm PTFE syringe filter, and spin cast on a silicon wafer substrate rotated at 3000 rpm for 30 s. The coated film was then baked for 2 min at 60° C. to remove residual solvent. During casting and baking the dibutyltin diacetate is partially hydrolyzed by atmospheric water, converting from a volatile molecular liquid carboxylate into a solid organotin oxo carboxylate. Ellipsometric measurements indicated a resist film thickness of ~22 nm.

Figure 18:
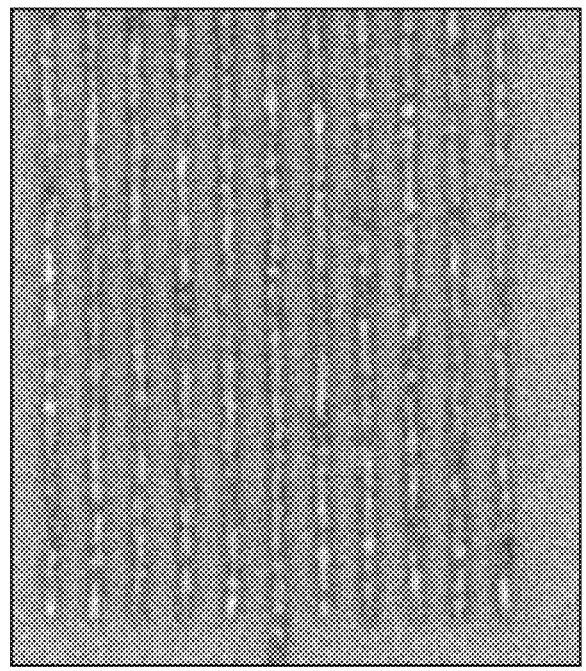
FIG. 18 is a scanning electron micrograph of a negative-tone patterned coating with lines on a 32 nm pitch in a coating formed with a dibutyltin oxo-carboxylate coating material following irradiation with a 30 kV electron beam at a dose of 1500 $\mu C/cm^2$ and developed in PGMEA.

Subsequent exposure of the film to a 30 kV electron beam rastered to form a pattern at a dose of 1500 μC cm$^{-2}$ was followed by a 60° C. hotplate PEB, and immersion in PGMEA for 30 s to develop the pattern by etching unexposed material. A final hardbake at 100° C. for 5 min was performed prior to SEM imaging. FIG. 18 contains an electron micrograph of the resulting negative tone line/space pattern on a 32-nm pitch.

Figure 19:
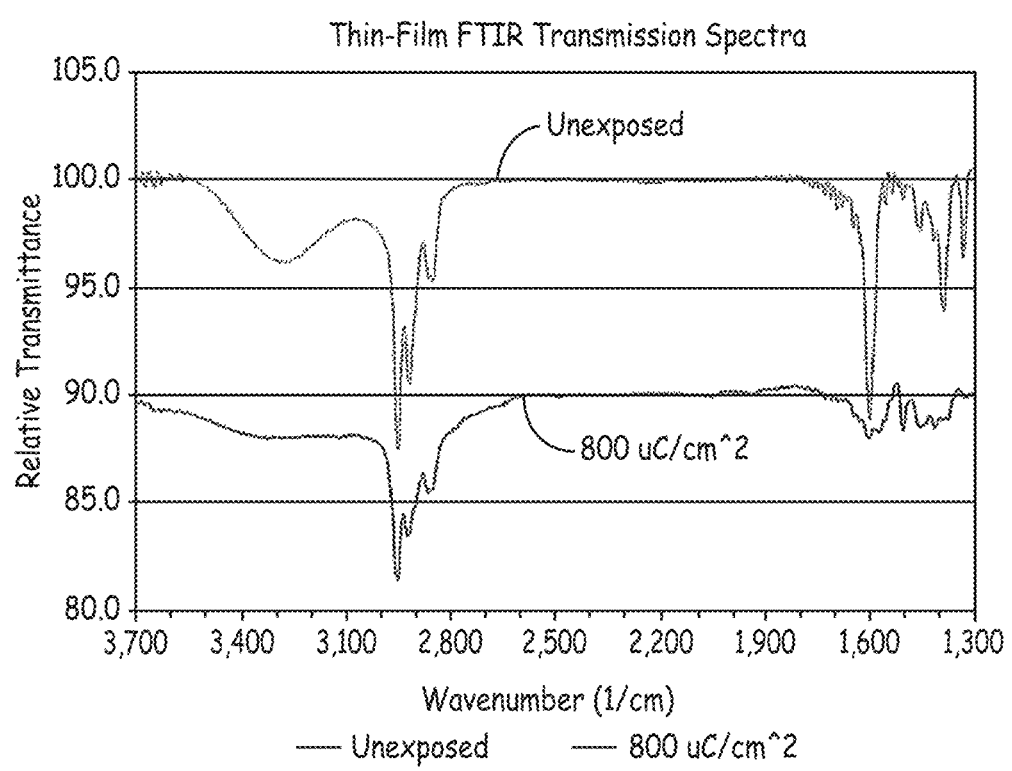
FIG. 19 is a comparative transmission-mode FTIR transmission spectra of a dibutyltin oxo-carboxylate film in an unexposed state and after exposure with a 30 kV electron beam at a dose of 800 $\mu C/cm^2$.

Generation of chemical contrast in the foregoing material upon radiation exposure via electron-beam may be observed by using transmission FTIR spectroscopy as illustrated in FIG. 19. The transmission spectra of an organotin oxo-carboxylate thin-film deposited on an un-doped silicon wafer and baked at 50° C. for 2 min was collected before and after exposure to a 30 kV electron beam (800 μC cm$^{-2}$). As with simple organotin oxo hydroxides, a strong decrease in the absorption peaks attributed to hydrocarbon C—H stretching and bending modes (2957, 2924, 2858, 1391, and 1331 cm$^{-1}$) is observed, confirming loss of alkyl ligands on exposure. Also readily apparent and unique to the carboxylate is the significant reduction in the absorbance centered at 1605 cm$^{-1}$, attributed to decomposition of carboxylate ligands and attendant reduction in carbonyl C=O absorption on exposure.

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein.

What is claimed is:

1. A method for patterning a substrate with radiation, the method comprising:
    irradiating a coated substrate along a selected pattern, wherein the coated substrate comprises a coating that comprises EUV radiation sensitive metal-carbon bonds, wherein exposure of the coating material to EUV radiation at a dose from about 3 mJ/cm$^2$ to 150 mJ/cm$^2$ alters the chemical properties of the coating material to create an exposed coating material with differential dissolution rates between exposed and unexposed regions of the coating material and wherein the irradiated regions are at least partially condensed to increase metal oxide character, wherein the metal of the metal—carbon bonds consists of Sn, Sb, In or a combination thereof.

2. The method of claim 1 wherein alkyl ligands form the metal—carbon bonds.

3. The method of claim 1 wherein a combination of different alkyl ligands form the metal—carbon bonds.

4. The method of claim 1 wherein the coating comprises metal—t-butyl ligand bonds.

5. The method of claim 1 wherein the coating comprises a metal oxo-hydroxo network with M-OH linkages and M-O-M linkages, where M represents the metal atom.

6. The method of claim 1 wherein the coating has a dried thickness from about 3 nanometers to about 40 nanometers.

7. The method of claim 1 wherein the coated substrate is formed with a process comprising using spin coating of a precursor composition.

8. The method of claim 1 further comprising heating the exposed coating material prior to development to a temperature from about 60° C. to about 175° C. for from about 0.5 minutes to about 30 minutes.

9. The method of claim 1 further comprising developing the exposed coating material with an organic developer to remove the unexposed regions of the coating material.

10. The method of claim 9 wherein the organic developer comprises propylene glycol monomethyl ester acetate.

11. The method of claim 1 further comprising developing the exposed coating material with an aqueous developer to remove the exposed regions of the coating material.

12. The method of claim 1 further comprising depositing a precursor solution onto the substrate to form a precursor coated substrate.

13. The method of claim 12 wherein the precursor solution comprises an alcohol.

14. The method of claim 12 wherein the precursor solution comprises an ester or a ketone.

15. The method of claim 12 wherein the metal-carbon bonds comprise tin-carbon bonds and—wherein the precursor solution has a tin concentration from about 0.01M to about 1.4M.

16. The method of claim 12 further comprising removing solvent from the precursor coated substrate to form the coated substrate.

17. The method of claim 16 wherein removing the solvent comprises heating the precursor coated substrate to temperatures from about 55° C. to about 225° C. for from about 0.5 minutes to about 30 minutes.

18. The method of claim 1 wherein the EUV dose is from 5 mJ/cm$^2$ to 100 mJ/cm$^2$.

19. The method of claim 1 wherein the EUV radiation has a wavelength of 13.5 nm.

20. The method of claim 1 wherein the selected pattern has features with adjacent linear segments of neighboring structures having an average pitch of no more than about 60 nm.

21. A method for patterning a substrate with radiation, the method comprising:
    irradiating a coated substrate along a selected pattern, wherein the coated substrate comprises a coating that comprises EUV radiation sensitive metal-carbon bonds, wherein exposure of the coating material to EUV radiation at a dose from about 3 mJ/cm$^2$ to 150 mJ/cm$^2$ alters the chemical properties of the coating material to create an exposed coating material with differential dissolution rates between exposed and unexposed regions of the coating material and wherein the irradiated regions are at least partially condensed to increase metal oxide character, wherein the coating comprises a first metal consisting of Sn, Sb, In or a combination thereof and a second metal consisting of one or more metal other than Sn, Sb or In, wherein the one or more metal other than Sn, Sb or In comprises Ti, Zr, Hf, V, Co, Mo, W, Al, Ga, Si, Ge, P, As, Y, La, Ce, Lu or combinations thereof, wherein the mole ratio of the second metal to the first metal is from about 0.1 to about 0.75.

* * * * *